US011652125B2

(12) United States Patent
Lee et al.

(10) Patent No.: US 11,652,125 B2
(45) Date of Patent: May 16, 2023

(54) IMAGE SENSOR

(71) Applicant: Samsung Electronics Co., Ltd., Suwon-si (KR)

(72) Inventors: Kyungho Lee, Suwon-si (KR); Bumsuk Kim, Hwaseong-si (KR); Eun Sub Shim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 182 days.

(21) Appl. No.: 16/997,351

(22) Filed: Aug. 19, 2020

(65) Prior Publication Data

US 2021/0183920 A1 Jun. 17, 2021

(30) Foreign Application Priority Data

Dec. 13, 2019 (KR) ........................ 10-2019-0167053

(51) Int. Cl.
*H01L 27/146* (2006.01)

(52) U.S. Cl.
CPC .... *H01L 27/1463* (2013.01); *H01L 27/14605* (2013.01); *H01L 27/14612* (2013.01); *H01L 27/14627* (2013.01); *H01L 27/14636* (2013.01); *H01L 27/14689* (2013.01)

(58) Field of Classification Search
CPC .................................................. H01L 27/1463
See application file for complete search history.

(56) References Cited

U.S. PATENT DOCUMENTS

| 8,426,238 | B2 | 4/2013 | Nishizawa et al. |
| 8,941,204 | B2 * | 1/2015 | Lin ...................... H01L 27/1463 |
| | | | 257/E21.573 |
| 9,231,019 | B2 * | 1/2016 | Shimotsusa ......... H01L 27/1463 |
| 9,324,752 | B2 * | 4/2016 | Chien ............... H01L 27/14685 |
| 9,559,134 | B2 * | 1/2017 | Yang ............... H01L 21/823878 |
| 9,609,250 | B2 | 3/2017 | Lee et al. |
| 9,627,426 | B2 * | 4/2017 | Chien ............... H01L 27/14629 |
| 9,748,299 | B2 | 8/2017 | Ahn et al. |
| 9,818,781 | B2 | 11/2017 | Lee et al. |
| 9,947,707 | B2 * | 4/2018 | Lee .................. H01L 27/14687 |
| 10,073,239 | B1 | 9/2018 | Jung et al. |
| 10,249,667 | B2 * | 4/2019 | Lee .................. H01L 27/14687 |

(Continued)

FOREIGN PATENT DOCUMENTS

CN 105336754 A 2/2016

*Primary Examiner* — David A Zarneke
(74) *Attorney, Agent, or Firm* — Muir Patent Law, PLLC

(57) ABSTRACT

An image sensor includes a semiconductor substrate having a first surface and a second surface with a pixel region having photoelectric conversion regions, a gate electrode disposed on the pixel region and adjacent to the first surface, a first isolation structure extending from the first surface toward the second surface, the first isolation structure comprising a first pixel isolation pattern enclosing the pixel region, and a first inner isolation pattern spaced apart from the first pixel isolation pattern and positioned between the photoelectric conversion regions, and a second isolation structure extending from the second surface toward the first surface with a top surface vertically spaced apart from at least a portion of a bottom surface of the first isolation structure. The bottom surface of the first isolation structure is closer to the second surface of the semiconductor substrate than to the first surface thereof.

20 Claims, 29 Drawing Sheets

(56) References Cited

U.S. PATENT DOCUMENTS

| | | | |
|---|---|---|---|
| 10,276,616 B2* | 4/2019 | Lin | H01L 27/14685 |
| 10,431,619 B2* | 10/2019 | Masagaki | H01L 27/14621 |
| 10,943,942 B2* | 3/2021 | Wei | H01L 31/035272 |
| 11,024,661 B2* | 6/2021 | Masagaki | H01L 27/14627 |
| 11,075,242 B2* | 7/2021 | Kuo | H01L 27/1463 |
| 11,302,730 B2* | 4/2022 | Cheng | H01L 27/14627 |
| 2018/0350856 A1 | 12/2018 | Masagaki et al. | |
| 2019/0043901 A1 | 2/2019 | Honda et al. | |
| 2019/0115388 A1 | 4/2019 | Jung et al. | |

* cited by examiner

IMAGE SENSOR

CROSS-REFERENCE TO RELATED APPLICATIONS

This U.S. non-provisional patent application claims priority under 35 U.S.C. § 119 to Korean Patent Application No. 10-2019-0167053, filed on Dec. 13, 2019, in the Korean Intellectual Property Office, the entire contents of which are hereby incorporated by reference.

BACKGROUND OF THE INVENTION

The present disclosure relates to an image sensor, and in particular, to a complementary metal-oxide-semiconductor (CMOS) image sensor.

An image sensor is a semiconductor device configured to convert optical images into electrical signals. The image sensor may be classified into two types: a charge coupled device (CCD) type and a complementary metal-oxide-semiconductor (CMOS) type. In general, the CMOS-type image sensor is called "CIS". The CIS includes a plurality of two-dimensionally arranged pixels, each of which includes a photodiode (PD) that converts incident light into an electrical signal.

SUMMARY

An embodiment of the inventive concept provides an image sensor having improved electric and optical characteristics.

According to an exemplary embodiment of the present inventive concept, an image sensor includes a semiconductor substrate having a first surface and a second surface, the semiconductor substrate comprising a pixel region with a plurality of photoelectric conversion regions, a gate electrode disposed on the pixel region and adjacent to the first surface, a first isolation structure extending from the first surface toward the second surface, the first isolation structure comprising a first pixel isolation pattern, which encloses the pixel region, and a first inner isolation pattern, which is spaced apart from the first pixel isolation pattern and is positioned between the plurality of photoelectric conversion regions, and a second isolation structure extending from the second surface toward the first surface, the second isolation structure having a top surface vertically spaced apart from at least a portion of a bottom surface of the first isolation structure. The bottom surface of the first isolation structure is closer to the second surface of the semiconductor substrate than to the first surface thereof.

According to an embodiment of the inventive concept, an image sensor may include a semiconductor substrate of a first conductivity type, the semiconductor substrate having a first surface and a second surface facing each other and including a plurality of pixel regions, a first pixel isolation pattern disposed in the semiconductor substrate to electrically separate a first pixel region, which is one of the pixel regions, from the others of the pixel regions, first and second photoelectric conversion regions, which are provided in the first pixel region and include impurities of a second conductivity type different from the first conductivity type, a first inner isolation pattern provided between the first and second photoelectric conversion regions and spaced apart from the first pixel isolation pattern, a connection region, which is provided between the first pixel isolation pattern and the first inner isolation pattern to connect the first and second photoelectric conversion regions, the connection region including impurities of the second conductivity type, and a second inner isolation pattern extended from the second surface toward the connection region and spaced apart from the first surface.

According to an embodiment of the inventive concept, an image sensor may include a semiconductor substrate of a first conductivity type, the semiconductor substrate including a pixel region and having a first surface and a second surface facing each other in a first direction, a plurality of photoelectric conversion regions, which are provided in the pixel region and include impurities that is of a second conductivity type different from the first conductivity type, a gate electrode provided on the photoelectric conversion regions and adjacent to the first surface, a first isolation structure, which is extended from the first surface toward the second surface, the first isolation structure including a first pixel isolation pattern, which encloses the pixel region, and a first inner isolation pattern, which is spaced apart from the first pixel isolation pattern and is positioned between the plurality of photoelectric conversion regions, a second isolation structure, which is extended from the second surface toward the first surface, the second isolation structure including a second pixel isolation pattern, which encloses the pixel region, and a second inner isolation pattern, which is connected to the second pixel isolation pattern and is overlapped with the pixel region, a barrier region, which is provided in the semiconductor substrate to cover side surfaces of the first isolation structure and includes impurities of the first conductivity type, and a connection region including impurities of the second conductivity type, the connection region being provided between the first pixel isolation pattern and the first inner isolation pattern to connect the plurality of photoelectric conversion regions.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions, and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown.

Figure 1:
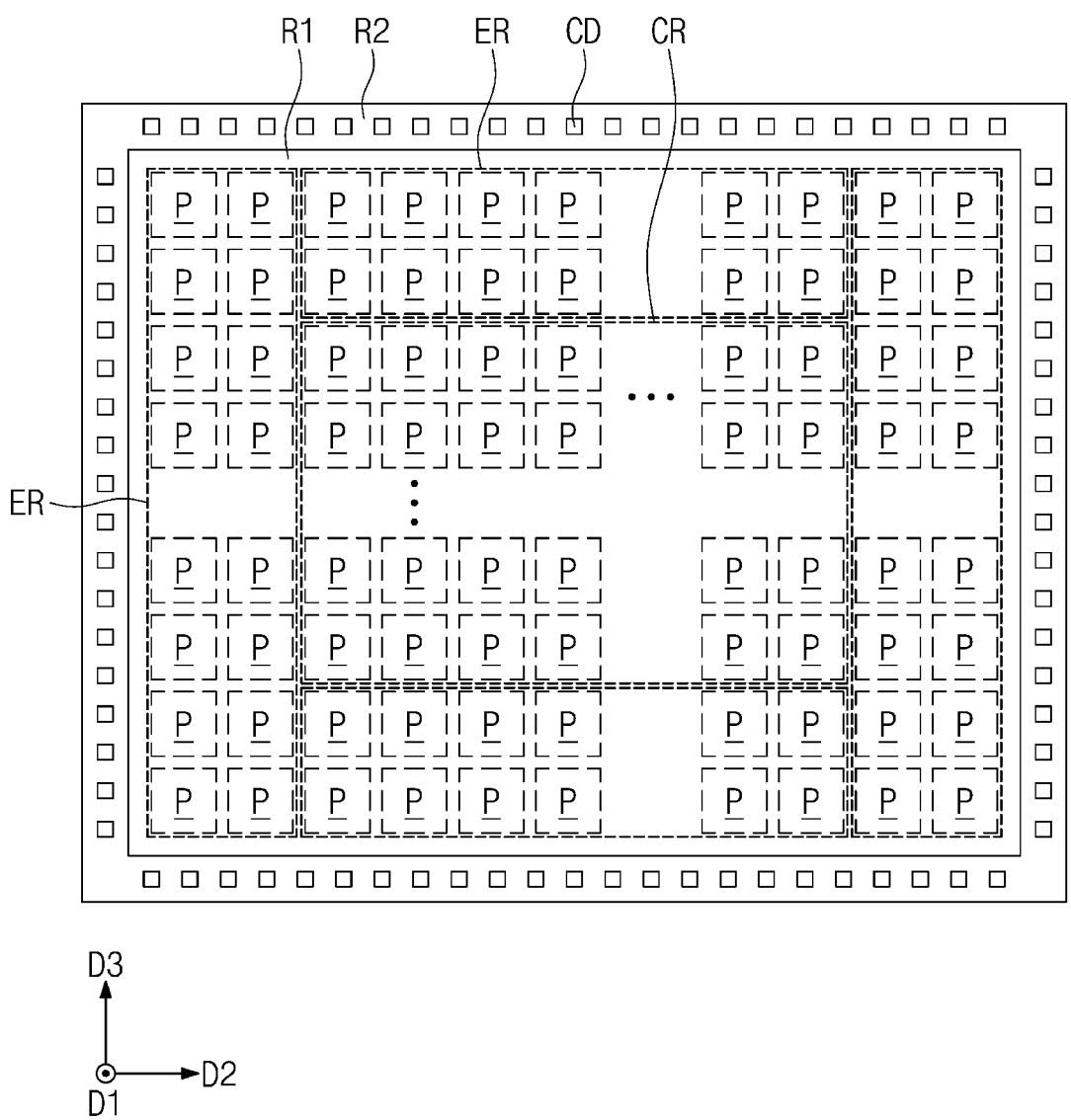
FIG. 1 is a plan view schematically illustrating an image sensor according to an embodiment of the inventive concept.

FIG. 1 is a plan view schematically illustrating an image sensor according to an embodiment of the inventive concept.

Referring to FIG. 1, the image sensor may include a pixel array region R1 and a pad region R2.

The pixel array region R1 may include a plurality of pixels P, which are two-dimensionally arranged. The pixel array region R1 may have a light-receiving surface that is normal to a first direction D1 or a thickness direction or a vertical direction of the image sensor. The thickness direction (or the vertical direction) may refer to a direction perpendicular to a first surface 100a of a semiconductor substrate 100. The pixels P may be arranged in a matrix shape or in two different directions (e.g., a second direction D2 and a third direction D3). The second direction D2 and the third direction D3 may be a direction parallel to the first surface 100a of the semiconductor substrate 100. In an embodiment, the first, second, and third directions D1, D2, and D3 may be orthogonal to each other. The pixel array region R1 may output electrical signals, which are produced in each of the pixels P by an incident light.

The pixel array region R1 may include a center region CR and an edge region ER enclosing the center region CR. When viewed in a plan view, the edge regions ER may be disposed at top, bottom, right, and left sides of the center region CR.

An angle of light, which is incident into the edge regions ER of the pixel array region R1, may be different from an angle of light, which is incident into the center region CR of the pixel array region R1. Thus, in an embodiment, the pixels P provided in the central region CR may be provided to have a structure different from the pixels P provided in the edge region ER. The present inventive concept is not limited thereto. In an embodiment, the pixels P provided in the central region CR may be provided to have the identical structure, but have a structure different from the pixels P provided in the edge region ER.

A plurality of conductive pads CP, which are used to input or output control and photoelectric signals, may be disposed in the pad region R2. In an embodiment, the conductive pads CP may include first pads for receiving control signals from an external device such as an image sensor controller and second pads for outputting photoelectric signals to an external device such as a display controller. The pad region R2 may be disposed to enclose the pixel array region R1, when viewed in a plan view, and the image sensor may be easily connected to an external device.

Figure 2:
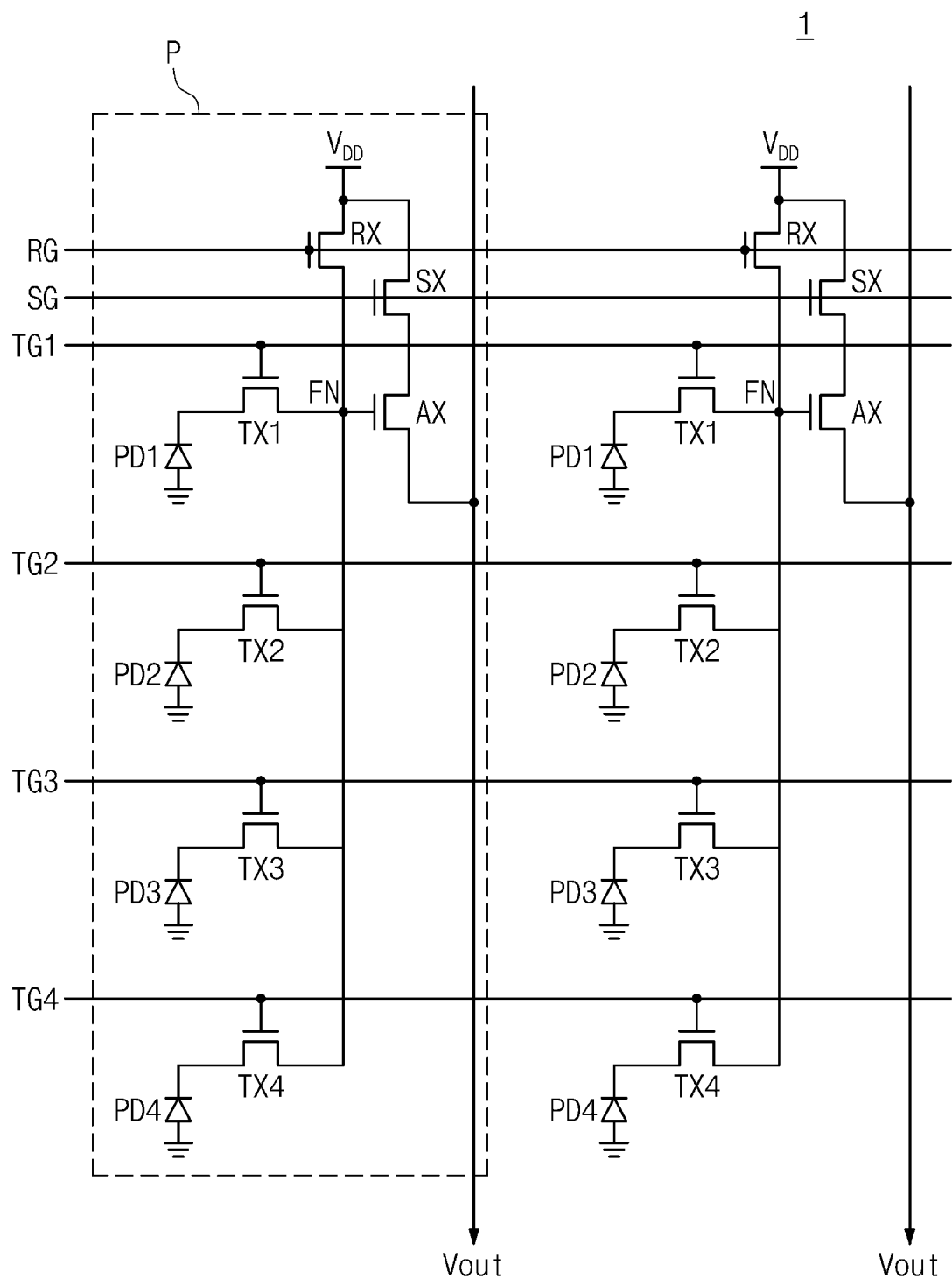
FIG. 2 is a circuit diagram illustrating an image sensor according to an embodiment of the inventive concept.

FIG. 2 is a circuit diagram illustrating an image sensor according to an embodiment of the inventive concept.

Referring to FIG. 2, each of the pixels P may include first to fourth photoelectric conversion devices PD1, PD2, PD3, and PD4, first to fourth transfer transistors TX1, TX2, TX3, and TX4, and logic transistors RX, SX, and AX. Here, the logic transistors may include a reset transistor RX, a selection transistor SX, and an amplifying transistor AX. Gate electrodes of the first to fourth transfer transistors TX1, TX2, TX3, and TX4, the reset transistor RX, and the selection transistor SX may be connected to the driving signal lines TG1, TG2, TG3, TG4, RG, and SG, respectively.

The first to fourth transfer transistors TX1, TX2, TX3, and TX4 may include first to fourth gate electrodes TG1, TG2, TG3, and TG4, respectively, and may be electrically connected to the first to fourth photoelectric conversion devices PD1, PD2, PD3, and PD4, respectively. In an embodiment, the first to fourth transfer transistors TX1, TX2, TX3, and TX4 may be connected to charge detection nodes FN or floating diffusion regions, respectively. In an embodiment, each of the charge detection nodes FN may be formed in a corresponding one of the pixels P. The transfer transistors TX1, TX2, TX3, and TX4 in each pixel P may share one charge detection node FN. In an embodiment, each of the charge detection nodes FN may be provided in a corresponding pixel of the pixels P to be connected to the transfer transistors TX1, TX2, TX3, and TX4.

The first to fourth photoelectric conversion devices PD1, PD2, PD3, and PD4 may be configured to generate photocharges in proportion to an amount of incident light. Each of the first to fourth photoelectric conversion devices PD1, PD2, PD3, and PD4 may be or include at least one of a photo diode, a photo transistor, a photo gate, or a pinned photo diode (PPD).

The charge detection nodes FN may be configured to cumulatively store the photocharges, which are generated in the first to fourth photoelectric conversion devices PD1, PD2, PD3, and PD4. The amplifying transistor AX may be controlled by an amount of the photocharges stored in the charge detection nodes FN.

The reset transistor RX may be configured to periodically discharge or reset the photocharges stored in the charge detection nodes FN. For example, a drain electrode of the reset transistor RX may be connected to the charge detection node FN, and a source electrode of the reset transistor RX may be connected to a power voltage VDD. If the reset transistor RX is turned on, the power voltage VDD may be applied to the charge detection node FN through the source electrode of the reset transistor RX. Accordingly, the photocharges stored in the charge detection node FN may be discharged to the power voltage VDD through the reset transistor RX, and thus, the charge detection node FN may be reset.

The amplifying transistor AX may amplify a change in electric potential of the charge detection node FN and may output a signal, which was amplified by the selection transistor SX, or a pixel signal to an output line VOUT. The amplifying transistor AX may be a source follower buffer amplifier, which is configured to generate a source-drain current in proportion to an amount of photocharges supplied to its gate electrode. The gate electrode of the amplifying transistor AX may be connected to the charge detection node FN, the drain of the amplifying transistor AX may be connected to the output line VOUT, and the source of the amplifying transistor AX may be connected to the drain of the selection transistor SX.

The selection transistor SX may be used to select a corresponding row of the pixels P during a read operation. If the selection transistor SX is turned on, the power voltage VDD, which is applied to the drain electrode of the amplifying transistor AX, may be applied to a drain electrode of the selection transistor SX.

Figure 3:
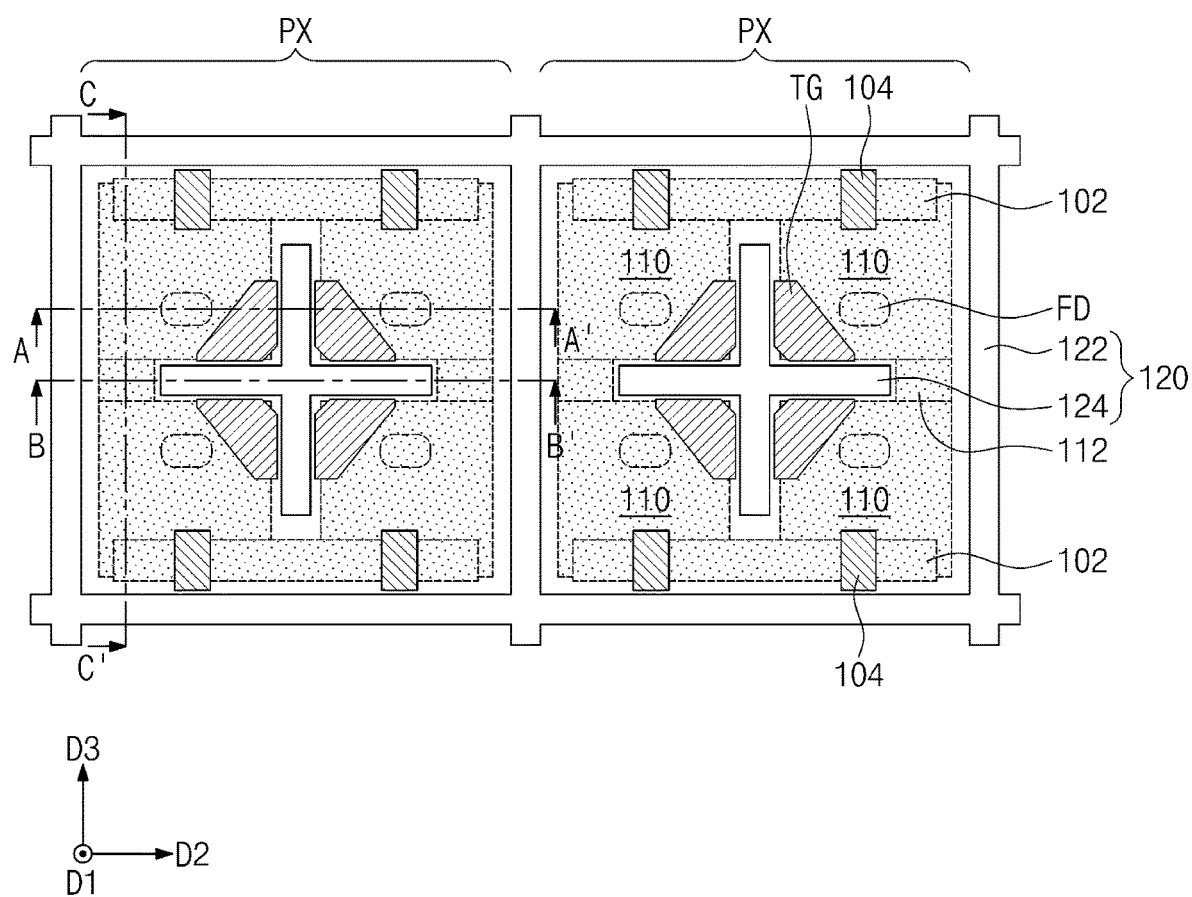
FIG. 3 is a plan view illustrating an image sensor according to an embodiment of the inventive concept.
Figure 4A:
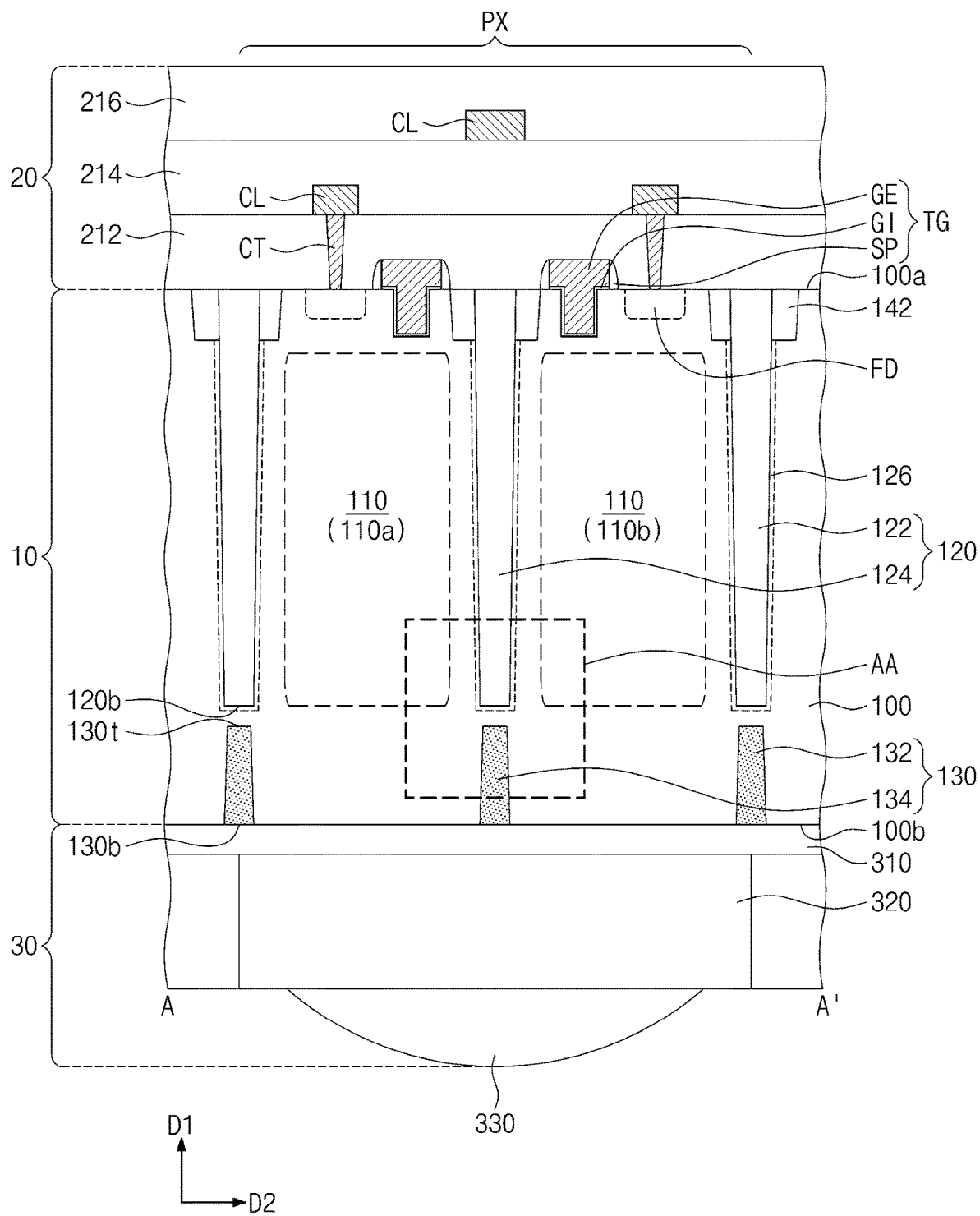
FIGS. 4A, 4B, and 4C are sectional views, which are respectively taken along lines A-A', B-B', and C-C' of FIG. 3.
Figure 4B:
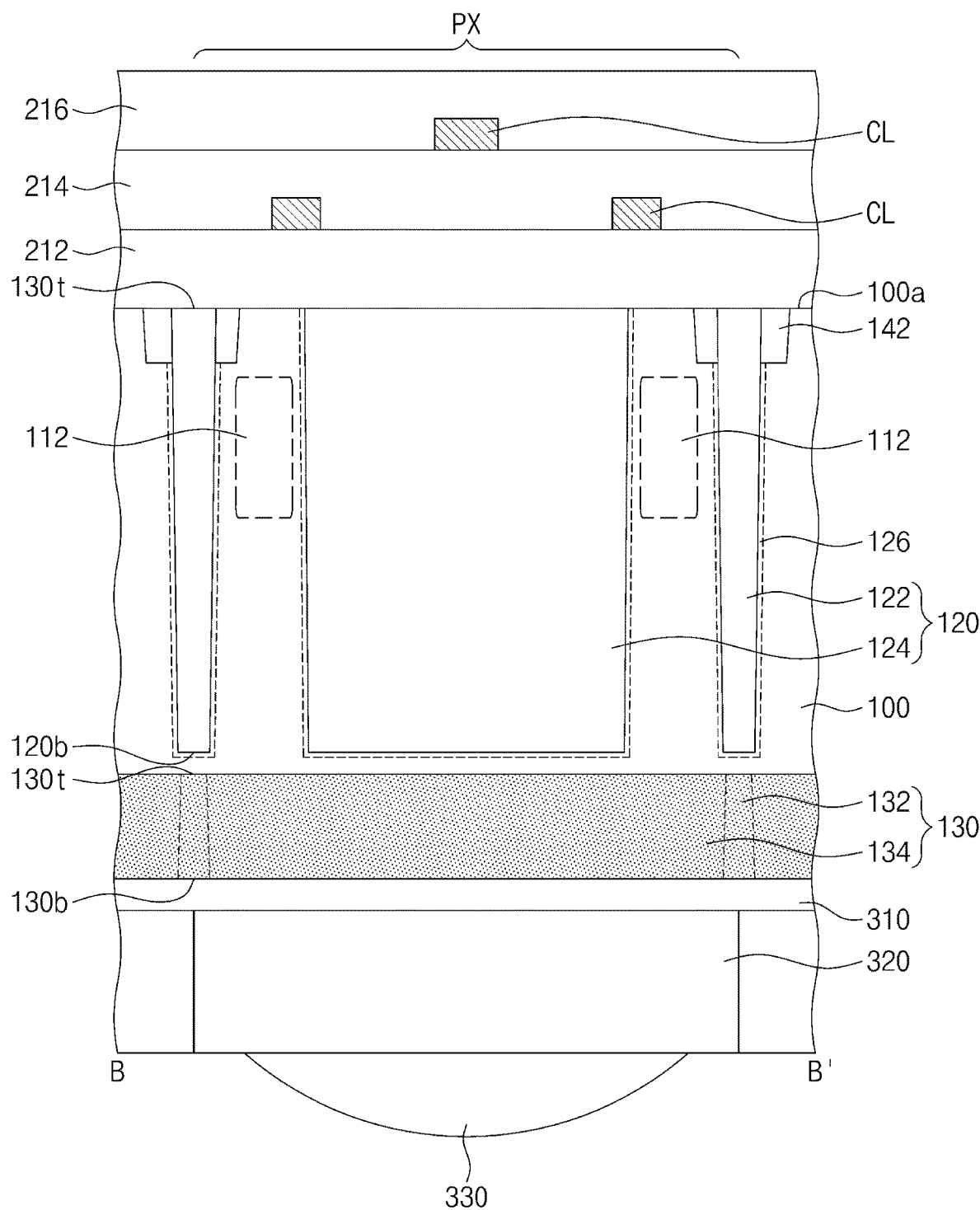
Figure 4C:
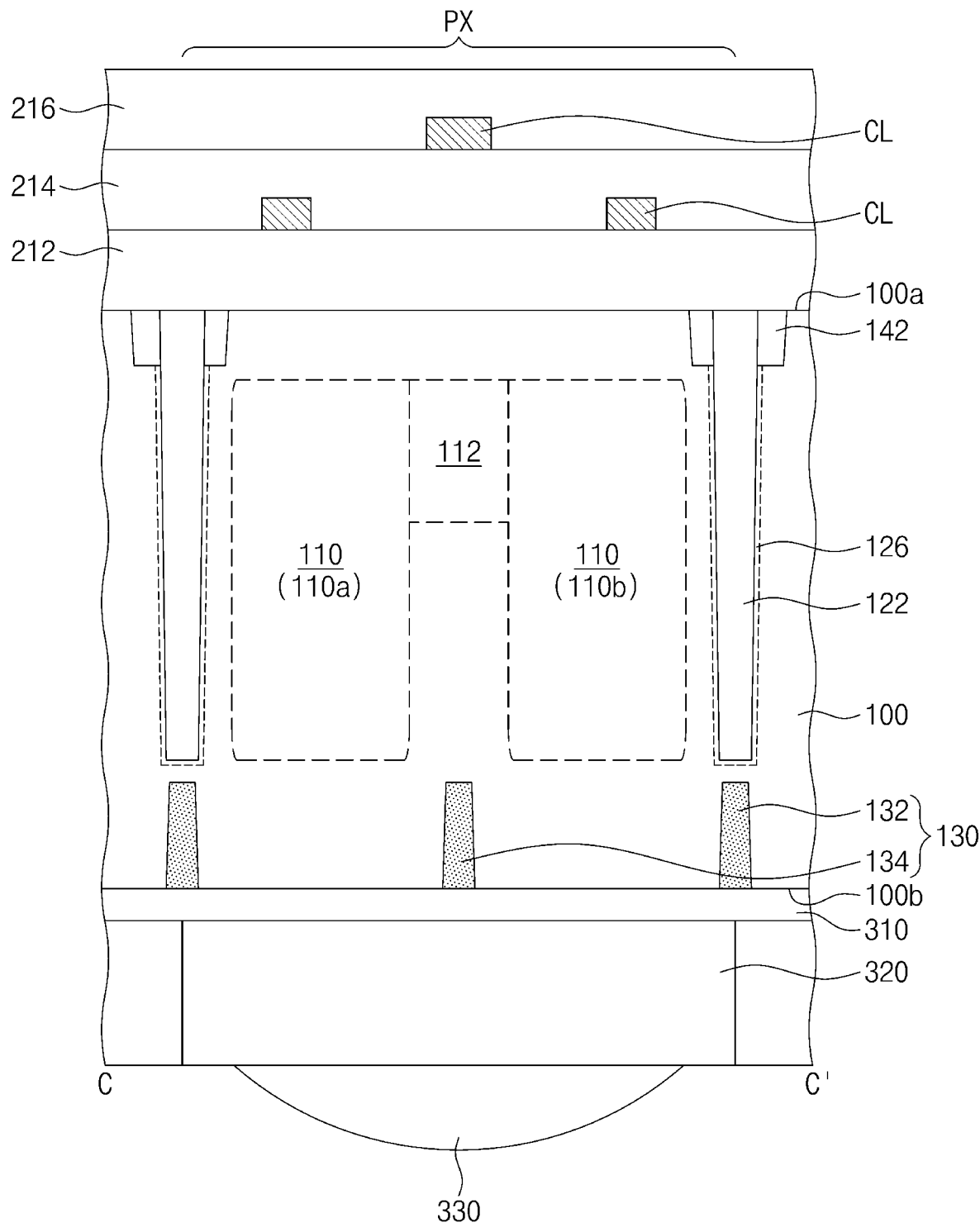
Figure 5A:
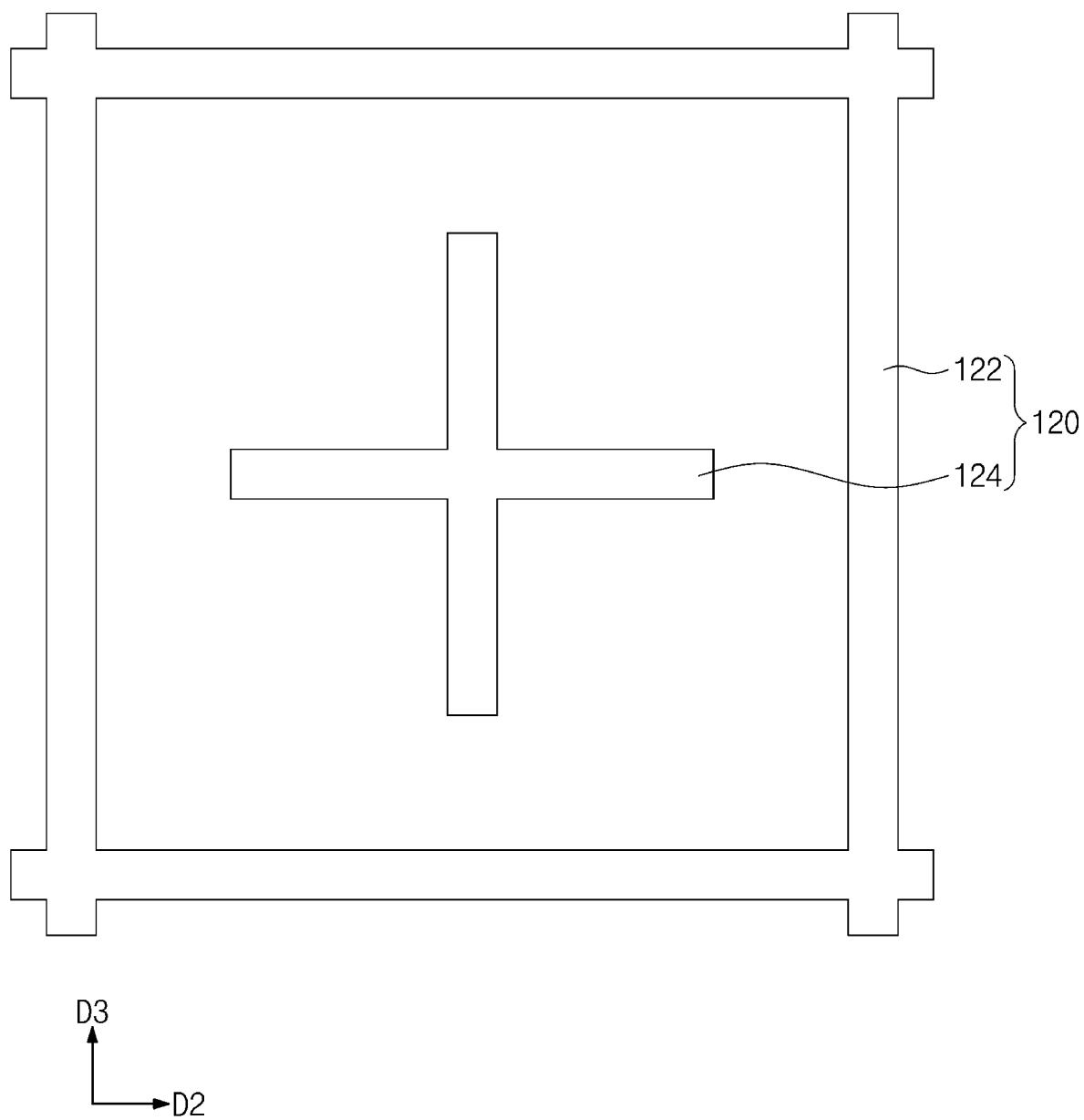
FIGS. 5A and 5B are plan views illustrating a first isolation structure and a second isolation structure, respectively.
Figure 5B:
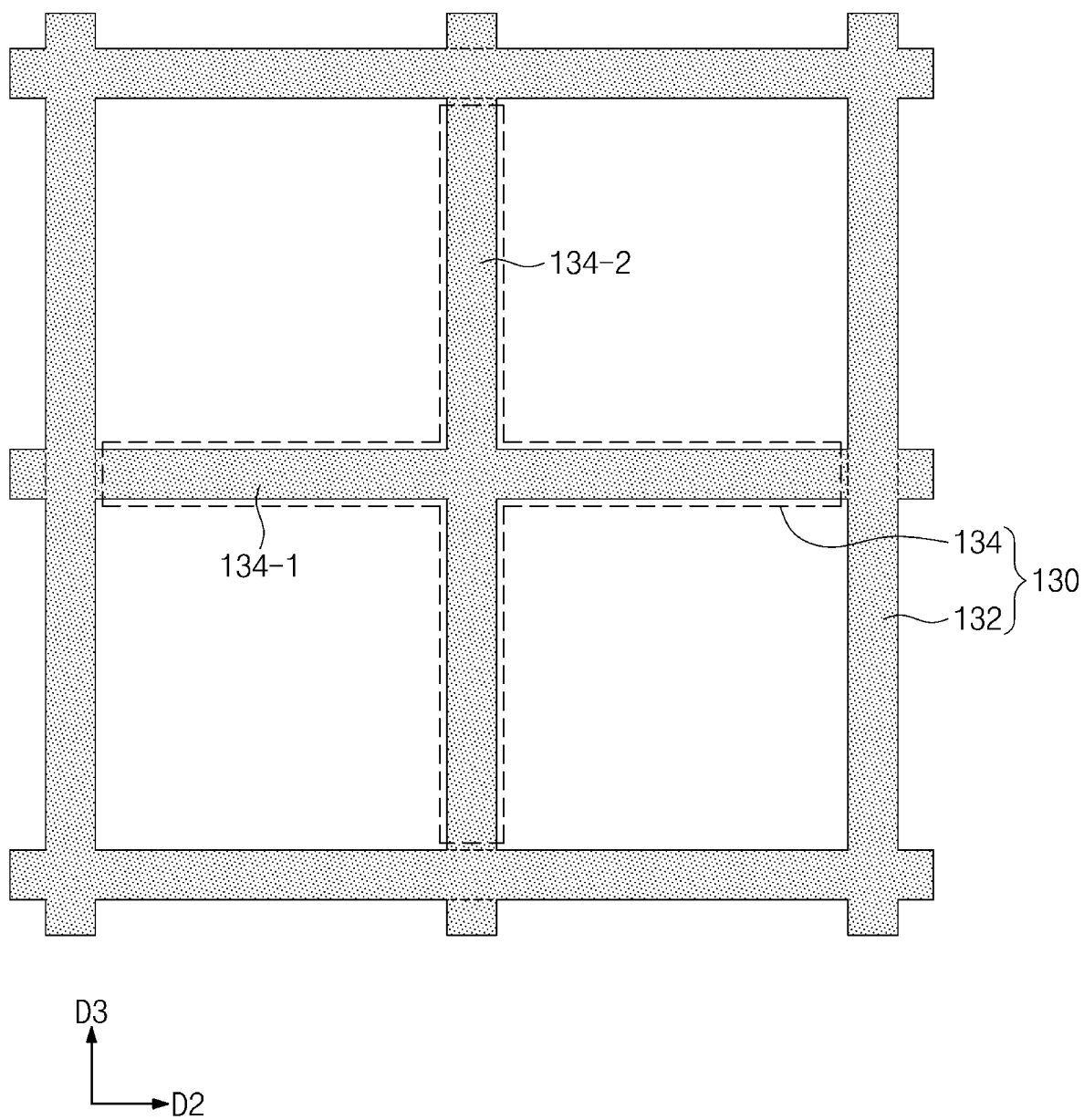
Figure 6:
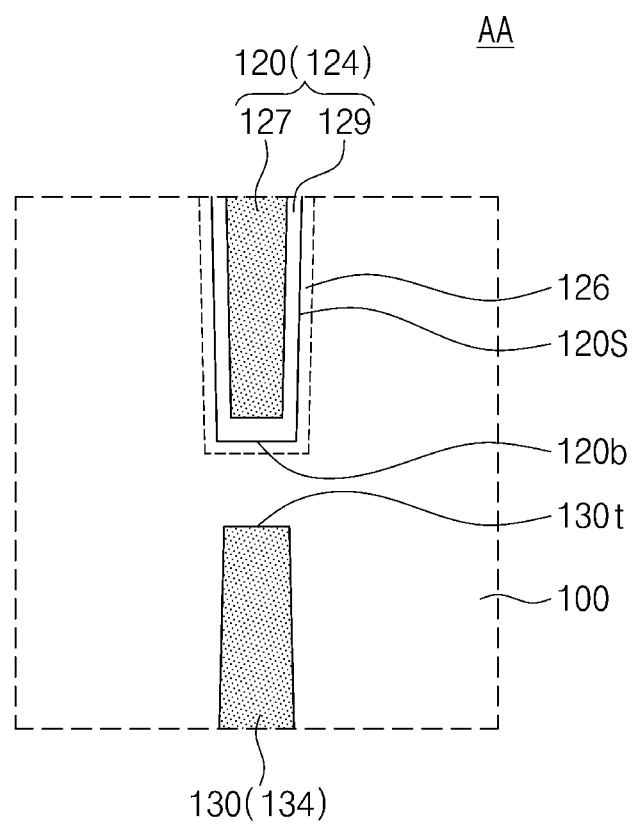
FIG. 6 is an enlarged sectional view illustrating a portion AA of FIG. 4A.

FIG. 3 is a plan view illustrating an image sensor according to an embodiment of the inventive concept. FIGS. 4A, 4B, and 4C are sectional views, which are respectively taken along lines A-A', B-B', and C-C' of FIG. 3. FIGS. 5A and 5B are plan views illustrating a first isolation structure and a second isolation structure, respectively. FIG. 6 is an enlarged sectional view illustrating a portion AA of FIG. 4A.

Referring to FIGS. 3 and 4A to 4C, the image sensor may include a photoelectric conversion layer 10, a read-out circuit layer 20, and an optically-transparent layer 30. The photoelectric conversion layer 10 may be disposed between the read-out circuit layer 20 and the optically-transparent layer 30, as shown in FIG. 4A. For example, the read-out circuit layer 20 may be disposed on a surface of the photoelectric conversion layer 10, and the optically-transparent layer 30 may be disposed on an opposite surface of the photoelectric conversion layer 10.

The photoelectric conversion layer 10 may include the semiconductor substrate 100, which includes a plurality of pixel regions PX, first and second pixel isolation patterns 122 and 132, which are disposed in the semiconductor substrate 100 to define the pixel regions PX, and first and second inner isolation patterns 124 and 134, which are disposed in the pixel regions PX to define a plurality of photoelectric conversion regions 110 within each of the pixel regions PX. The photoelectric conversion regions 110 may convert light, which is incident from the outside, to electrical signals.

The read-out circuit layer 20 may include read-out circuits (e.g., MOS transistors), which are connected to the photoelectric conversion layer 10. The read-out circuits may include the logic transistors previously described with reference to FIG. 2. The read-out circuit layer 20 may perform a signal processing operation on electrical signals generated from the photoelectric conversion layer 10.

The optically-transparent layer 30 may include micro lenses 330, which are arranged in a matrix shape, and may include color filters 320 between the micro lenses 330 and the photoelectric conversion layer 10. Each of the color filters 320 may include one of red, green, and blue filters, depending on the color of each unit pixel. However, in certain embodiments, some of the color filters 320 may include infrared filters.

In an embodiment, the semiconductor substrate 100 may have a first or front surface 100a and a second or rear surface 100b, which are opposite to each other in the first direction D1. The semiconductor substrate 100 may include a bulk silicon substrate of a first conductivity type and an epitaxial layer, which is formed on the bulk silicon substrate and is of the first conductivity type. In an embodiment, the bulk silicon substrate may be removed during a fabrication process of the image sensor, and in this case, the semiconductor substrate 100 may be composed of the epitaxial layer of the first conductivity type. In certain embodiments, the semiconductor substrate 100 may be a bulk semiconductor substrate, in which a well region of the first conductivity type is provided. The first conductivity type may be, for example, p-type.

A first isolation structure 120, which is extended from the first surface 100a toward the second surface 100b, may be provided in the semiconductor substrate 100. In addition, a second isolation structure 130, which is extended from the second surface 100b toward the first surface 100a, may be provided in the semiconductor substrate 100. A bottom surface 120b of the first isolation structure 120 may face a top surface 130t of the second isolation structure 130. For example, the bottom surface 120b of the first isolation structure 120 may be spaced, in the first direction D1, apart from the top surface 130t of the second isolation structure 130. The bottom surface 120b of the first isolation structure 120 may overlap, in the first direction D1, the top surface 130t of the second isolation structure 130. Here, the first isolation structure 120 may have a length that is greater than that of the second isolation structure 130, when measured in the first direction D1. The bottom surface 120b of the first isolation structure 120 may be closer to the second surface 100b than to the first surface 100a of the semiconductor substrate 100.

The first isolation structure 120 may include a first pixel isolation pattern 122 and a first inner isolation pattern 124. The second isolation structure 130 may include a second pixel isolation pattern 132 and a second inner isolation pattern 134. The first isolation structure 120 and the second isolation structure 130 may be overlapped with each other in the first direction D1 and may be spaced apart from each other in the first direction D1.

The first pixel isolation pattern 122 of the first isolation structure 120 and the second pixel isolation pattern 132 of the second isolation structure 130 may separate one of the pixel regions PX in the semiconductor substrate 100 from the others. When viewed in a plan view, the first and second pixel isolation patterns 122 and 132 may enclose the pixel region PX. In an embodiment, the first and second pixel isolation patterns 122 and 132 may enclose two adjacent ones of the pixel regions PX, as shown in FIGS. 3 and 4A. In addition, the first and second pixel isolation patterns 122 and 132 may be provided to cross a region between two adjacent ones of the pixel regions PX. For the simplicity of drawings, FIG. 3 shows only two pixel regions PX defined by the first and second pixel isolation patterns 122 and 132, but the present inventive concept is not limited thereto. Each pixel region (or pixel P) in the pixel array region R1 as shown in FIG. 1 may be defined using the first and second pixel isolation patterns 122 and 132.

The first and second pixel isolation patterns 122 and 132 may be overlapped with each other, when viewed in a plan view. A bottom surface of the first pixel isolation pattern 122 may face a top surface of the second pixel isolation pattern 132. The bottom surface of the first pixel isolation pattern 122 and the top surface of the second pixel isolation pattern 132 may be adjacent to each other in the first direction D1. The first and second pixel isolation patterns 122 and 132 may be disposed between the pixel regions to prevent light, which is incident into one of the pixel regions PX, from entering a neighboring pixel region PX. In an embodiment, the pixel regions may be defined by the first and second pixel isolation patterns 122 and 132.

The first and second inner isolation patterns 124 and 134 may be provided in each of the pixel regions PX. The first and second inner isolation patterns 124 and 134 may be disposed between the photoelectric conversion regions 110 to prevent light, which is incident into one of the photoelectric conversion regions 110, from entering the others of the photoelectric conversion regions 110. In an embodiment, the first and second inner isolation patterns 124 and 134 may define the photoelectric conversion regions 110 in each pixel region PX. The photoelectric conversion regions 110 in each pixel region PX may be optically separated from each other by the first and second inner isolation patterns 124 and 134. The first and second inner isolation patterns 124 and 134 may electrically separate each of the photoelectric conversion regions 110 in each pixel region PX. The first and second inner isolation patterns 124 and 134 may be overlapped with each other in the first direction D1. A bottom surface of the first inner isolation pattern 124 may face a top surface of the second inner isolation pattern 134. The bottom surface of the first inner isolation pattern 124 and the top surface of the second inner isolation pattern 134 may be adjacent to each other in the first direction D1.

The first inner isolation pattern 124 may be spaced apart from the first pixel isolation pattern 122, as shown in FIG. 5A. For example, the first inner isolation pattern 124 may be horizontally spaced apart from the first pixel isolation pattern 122. The second inner isolation pattern 134 may be connected to the second pixel isolation pattern 132, as shown in FIG. 5B. For example, the second inner isolation pattern 134 may be connected to an inner sidewall of the second pixel isolation pattern 132. In an embodiment, the second inner isolation pattern 134 and the second pixel isolation pattern 132 may be provided as a single pattern. When viewed in a plan view, the first and second pixel isolation patterns 122 and 134 may have a rectangular shape. Each of the first and second inner isolation patterns 124 and 134 may be a cross-shaped structure having two portions extending in the second and third directions D2 and D3. Lengths of the first inner isolation pattern 124 in the second and third directions D2 and D3 may be smaller than those of the second inner isolation pattern 134. In an embodiment, the second inner isolation pattern 134 may include a first pattern 134-1 extending in the second direction D2 and a second pattern extending in the third direction D3. The first pattern 134-1 and the second pattern 134-2 may cross each other. In an embodiment, the second pixel isolation pattern 132, the first pattern 134-1 of the second inner isolation pattern 134 and the second pattern 134-2 of the second inner isolation pattern 134 may be arranged to divide the pixel region PX into a plurality of sub-pixel regions (for example, four sub-pixel regions). Each of the plurality of photoelectric conversion regions 110 may be disposed in a corresponding sub-pixel region of the plurality of sub-pixel regions.

As shown in FIG. 6, the first isolation structure 120 may include a first gapfill pattern 127 and a second gapfill pattern 129, which is disposed between the first gapfill pattern 127 and the semiconductor substrate 100. The first gapfill pattern 127 may have a refractive index different from that of the second gapfill pattern 129. For example, the first gapfill pattern 127 may have a refractive index lower than that of the second gapfill pattern 129. The first gapfill pattern 127 may be formed of or include at least one of, for example, conductive materials.

A barrier region 126 may be provided in the semiconductor substrate 100 and adjacent to the first isolation structure 120. The barrier region 126 may cover side and bottom surfaces 120S and 120b of the first isolation structure 120. The barrier region 126 may contain impurities which have the same conductivity type (e.g., the first conductivity type or p-type) as the semiconductor substrate.

Referring back to FIGS. 3 and 4A to 4C, the barrier region 126 may be provided on side and bottom surfaces of the first pixel isolation pattern 122 and the first inner isolation pattern 124. Here, a concentration of the first conductivity type impurities in the barrier region 126 may be higher than a concentration of the first conductivity type impurities in the semiconductor substrate 100. The formation of the first isolation structure 120 may include patterning the semiconductor substrate 100 to form a deep trench, and an inner surface of the deep trench may have surface defects producing electron-hole pairs (EHPs). The EHPs may cause a dark current issue. However, the barrier region 126 may suppress the dark current, which may be caused by the EHPs.

The photoelectric conversion regions 110 may be provided in each of the pixel regions PX. The photoelectric conversion regions 110 may be arranged in the second and third directions D2 and D3 to form a matrix shape. The photoelectric conversion regions 110 may produce photocharges. The amount of the produced photocharges may be in proportional to an intensity of the incident light. The photoelectric conversion regions 110 may be formed by injecting impurities, which have a different conductivity type (e.g., the second conductivity type) from the semiconductor substrate 100, into the semiconductor substrate 100. For example, the photoelectric conversion regions 110 may be an impurity region that contains impurities of the second conductivity type. A junction between the semiconductor substrate 100 of the first conductivity type and the photoelectric conversion region 110 of the second conductivity type may serve as a photodiode. The second conductivity type may be, for example, n-type.

In an embodiment, each of the photoelectric conversion regions 110 may be provided to have a difference in impurity concentration between portions adjacent to the first and second surfaces 100a and 100b, thereby having a non-vanishing gradient in potential (e.g., between the first and second surfaces 100a and 100b of the semiconductor substrate 100). In an embodiment, the photoelectric conversion regions 110 may include a plurality of impurity regions, which are vertically stacked and have different impurity concentrations in the first direction D1.

In an embodiment, a bottom end of the photoelectric conversion regions 110 may be positioned at a vertical level higher than the top surface 130t of the second isolation structure 130. For example, the photoelectric conversion regions 110 may not be positioned at the same vertical level as the top surface 130t of the second isolation structure 130. Thus, a portion of the semiconductor substrate 100, which is located at the same vertical level as the top surface 130t of the second isolation structure 130, may not be doped with the second conductivity type impurities. The pixel region PX of the semiconductor substrate 100 may have a concentration of the first conductivity type impurities that is higher than a concentration of the second conductivity type impurities, at the same vertical level as the top surface 130t of the second isolation structure 130.

The photoelectric conversion regions 110 may include a first photoelectric conversion region 110a and a second photoelectric conversion region 110b, which is spaced apart from the first photoelectric conversion region 110a with the first inner isolation pattern 124 interposed therebetween. For example, the first photoelectric conversion region 110a may be provided on a side surface of the first inner isolation pattern 124, and the second photoelectric conversion region 110b may be provided on an opposite side surface of the first inner isolation pattern 124. In the present specification, the first and second photoelectric conversion regions 110a and 110b may refer to two adjacent ones of the photoelectric conversion regions 110 in one of the second direction D2 and the third direction D3, rather than two adjacent photoelectric conversion regions 110 only in a specific direction in the pixel region PX.

As shown in FIG. 4C, a connection region 112 may be formed between the first and second photoelectric conversion regions 110a and 110b. The connection region 112 may contain the second conductivity type impurities. The connection region 112 may connect the first photoelectric conversion region 110a to the second photoelectric conversion region 110b. For example, the second conductivity type impurities may be continuously distributed in the first photoelectric conversion region 110a, the connection region 112, and the second photoelectric conversion region 110b. In an embodiment, the connection region 112 and portions of the first and second photoelectric conversion regions 110a and 110b may be simultaneously formed by the same ion implantation process. Thus, a concentration of the second conductivity type impurities in the first and second photoelectric conversion regions 110a and 110b may be equal to that in the connection region 112, when measured at the same vertical level. The connection region 112 may be positioned at a vertical level between the top and bottom surfaces 120t and 120b of the first isolation structure 120. For example, the connection region 112 may be positioned at a vertical level between the top and bottom surfaces of the first inner isolation pattern 124.

The connection region 112 may be formed between the first inner isolation pattern 124 and the first pixel isolation pattern 122, as shown in FIG. 4B. The connection region 112 may be closer to the first surface 100a of the semiconductor substrate 100 than to the second surface 100b of the semiconductor substrate 100. The connection region 112 may be overlapped with the second isolation structure 130, when viewed in a plan view. For example, the connection region 112 may be overlapped with the second inner isolation pattern 134, but not with the second pixel isolation pattern 132, when viewed in a plan view. A bottom end of the connection region 112 may be positioned at a vertical level that is higher than those of bottom ends of the first and second photoelectric conversion regions 110a and 110b.

A device isolation layer 142 may be disposed adjacent to the first surface 100a of the semiconductor substrate 100. The device isolation layer 142 may define active regions, on which gate structures TG and logic transistors are disposed, in a portion of the semiconductor substrate 100 adjacent to the first surface 100a. The device isolation layer 142 may be formed in a trench, which is recessed from the first surface 100a of the semiconductor substrate 100 toward the second surface 100b. The device isolation layer 142 may be overlapped with the first isolation structure 120. For example, a portion of the first isolation structure 120 may be formed in the device isolation layer 142. A bottom surface of the device isolation layer 142 may be closer to the first surface 100a of the semiconductor substrate 100 than to the bottom surface of the first isolation structure 120. For example, the device isolation layer 142 may have a depth smaller than the first isolation structure 120.

The read-out circuit layer 20 may be disposed on the first surface 100a of the semiconductor substrate 100. The read-out circuit layer 20 may include the read-out circuits (e.g., MOS transistors) electrically connected to the photoelectric conversion regions 110. In an embodiment, the read-out circuit layer 20 may include the reset transistor RX, the selection transistor SX, and the amplifying transistor AX previously described with reference to FIG. 2. In addition, the read-out circuit layer 20 may further include connection lines CL and contact plugs CT, which are electrically connected to MOS transistors.

In an embodiment, logic gates 104 and well impurity regions 102 may be placed on the first surface 100a of the semiconductor substrate 100. The logic gates 104 and the well impurity regions 102 may be disposed on each of the pixel regions PX. The logic gates 104 may include gate electrodes of the reset transistor RX, the amplifying transistor AX and the selection transistor SX, described with reference to FIG. 2. The well impurity regions 102 may be disposed at both sides of each of the logic gates 104. The well impurity regions 102 may be formed adjacent to the first surface 100a of the semiconductor substrate 100. The well impurity regions 102 may include the second conductivity type impurities. The well impurity regions 102 may be used as source or drain electrodes of the reset transistor RX, the amplifying transistor AX, and the selection transistor SX.

The gate structures TG may be disposed on the first surface 100a of the semiconductor substrate 100. A plurality of the gate structures TG may be disposed on each of the pixel regions PX. The gate structures TG may be disposed in a center portion of each of the pixel regions PX, when viewed in a plan view. The gate structures TG may be disposed on the photoelectric conversion regions 110, respectively. One gate structure TG may be disposed on one photoelectric conversion region 110. For example, in the pixel region PX, the number of the gate structures TG may be the same as that of the photoelectric conversion regions 110. The gate structure TG may include a gate electrode GE, a gate insulating layer GI, and a gate spacer SP. The gate electrode GE may be disposed adjacent to the first surface 100a of the semiconductor substrate 100 and may include a portion that is extended to a position lower than the first surface 100a. Such a portion of the gate electrode GE may be disposed in the semiconductor substrate 100, and the gate insulating layer GI may be interposed between the gate electrode GE and the semiconductor substrate 100. Side surfaces of portions of the gate electrode GE, which are placed on the first surface 100a of the semiconductor substrate 100, may be covered with the gate spacers SP.

A floating diffusion region FD may be provided in a portion of the semiconductor substrate 100 located around the gate structure TG. The floating diffusion region FD may contain or may be formed of the second conductivity type impurities. The floating diffusion regions FD may be, for example, n-type impurity regions.

Interlayered insulating layers 212, 214, and 216 may be stacked on the first surface 100a of the semiconductor substrate 100, and in an embodiment, the interlayered insulating layers 212, 214, and 216 may cover the logic transistors, which constitute the read-out circuits, and the gate structures TG. The interlayered insulating layers 212, 214, and 216 may be formed of or include at least one of, for example, silicon oxide, silicon nitride, and/or silicon oxynitride. The connection lines CL may be disposed on each of interlayered insulating layers 210 and may be electrically connected to the read-out circuits through the contact plugs CT.

The contact plugs CT may be disposed in the interlayered insulating layers 212, 214, and 216. The contact plugs CT may be coupled to the floating diffusion regions FD, the source/drain impurity regions, or the reset, amplifying, and selection gate electrodes RG, AG, and SG.

Each of the contact plugs CT and the connection lines CL may include a barrier metal layer and a metal layer. The barrier metal layer may be formed of or include at least one of metal nitrides (e.g., titanium nitride, tantalum nitride, tungsten nitride, hafnium nitride, and zirconium nitride). The metal layer may be formed of or include at least one of tungsten, copper, hafnium, zirconium, titanium, tantalum, aluminum, ruthenium, palladium, platinum, cobalt, nickel, and conductive metal nitrides. In an embodiment, silicide layers may be formed between the contact plugs CT and the impurity regions.

The optically-transparent layer 30 may be disposed on the second surface 100b of the semiconductor substrate 100. The optically-transparent layer 30 may include a buffer insulating layer 310, the color filters 320, and the micro lenses 330.

The buffer insulating layer 310 may cover the second surface 100b of the semiconductor substrate 100. The buffer insulating layer 310 may be in contact with the second surface 100b of the semiconductor substrate 100 and a bottom surface 130b of the second isolation structure 130. The term "contact," as used herein, refers to a direct connection (i.e., touching) unless the context indicates otherwise. The buffer insulating layer 310 may be formed of an insulating material whose refractive index is different from the semiconductor substrate 100. For example, the buffer insulating layer 310 may be formed of or include an insulating material having a refractive index smaller than silicon. For example, the buffer insulating layer 310 may have a refractive index between about 1.4 and about 4.0. For example, the buffer insulating layer 310 may be formed of or include at least one of $Al_2O_3$, $CeF_3$, HfO2, ITO, MgO, $Ta_2O_5$, $TiO_2$, $ZrO_2$, Si, Ge, ZnSe, ZnS, or $PbF_2$. The terms "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range. In an embodiment, the buffer insulating layer 310 may be formed of or include at least one of organic materials having high refractive indices (e.g., siloxane resin, benzocyclobutene (BCB), polyimide, acryl, parylene C, poly(methyl methacrylate) (PMMA), polyethylene terephthalate (PET), or the like). In an embodiment, the buffer insulating layer 310 may be formed of or include at least one of, for example, strontium titanate ($SrTiO_3$), polycarbonate, glass, bromine, sapphire, cubic zirconia, potassium niobate ($KNbO_3$), moissanite (SiC), gallium(III) phosphide (GaP), gallium(III) arsenide (GaAs), or the like.

The color filters 320 and the micro lenses 330 may be formed to overlap the pixel regions PX, respectively. Each of the color filters 320 may include one of red, green, and blue filters, depending on the color of each unit pixel. The micro lens 330 may have a convex shape and may have a predetermined curvature radius. Each of the micro lenses 330 may be used to concentrate the incident light on a corresponding one of the pixel regions PX. The micro lenses 330 may be formed of or include an optically transparent resin.

In the following embodiments, a previously described element may be identified by the same reference number without repeating an overlapping description thereof, for the sake of brevity.

Figure 7:
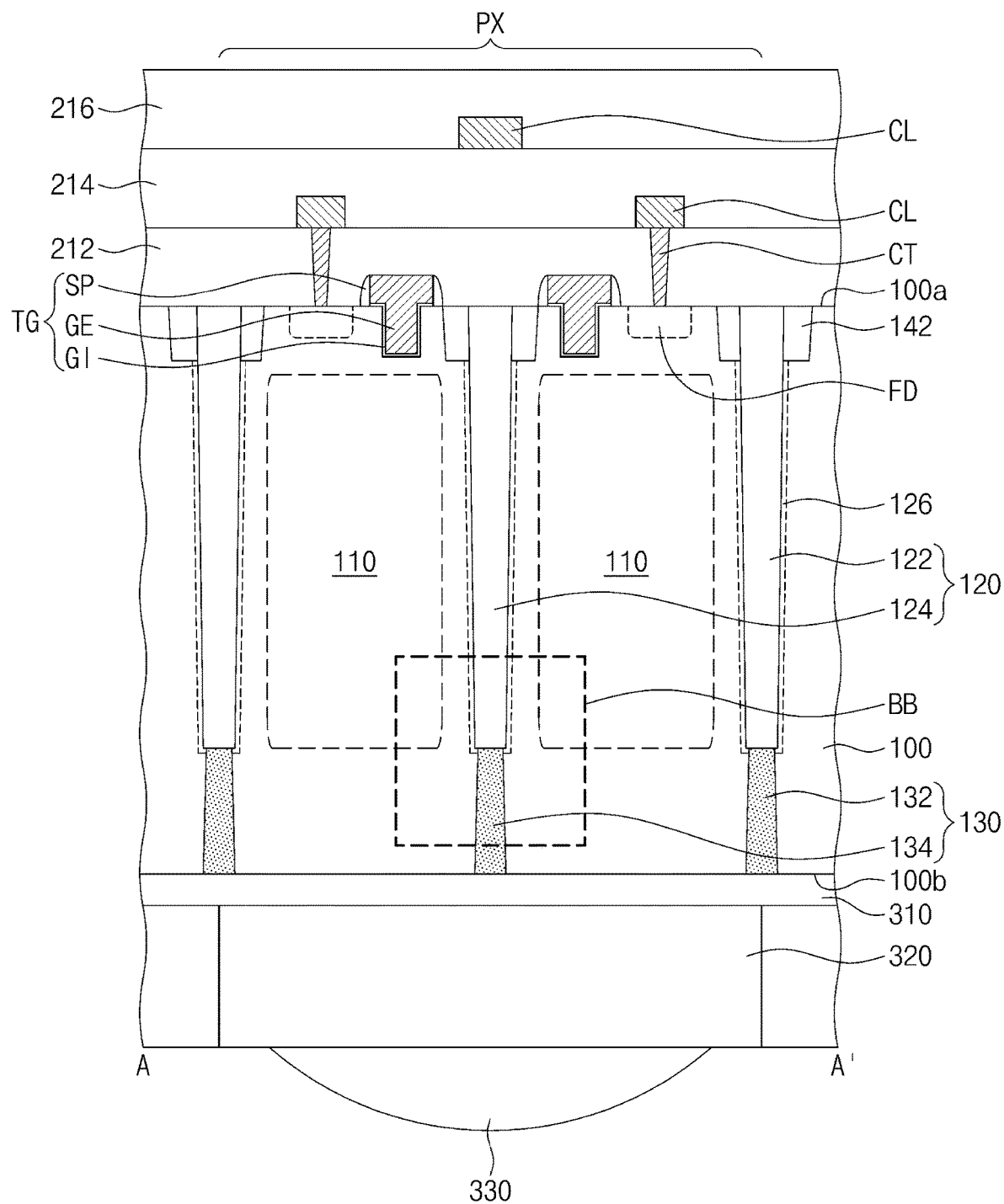
FIG. 7 is a sectional view, which is taken along line A-A' of FIG. 3 to illustrate an image sensor according to an embodiment of the inventive concept.
Figure 8A:
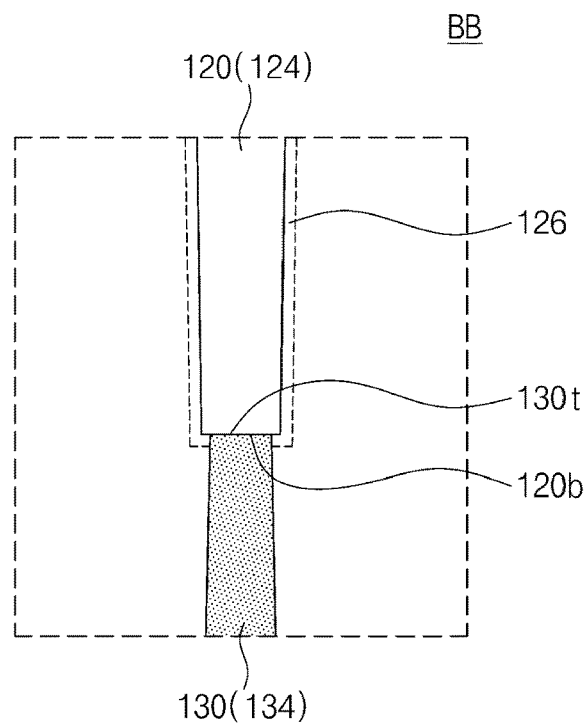
FIGS. 8A and 8B are enlarged sectional views, each of which corresponds to a portion 'BB' of FIG. 7.

FIG. 7 is a sectional view, which is taken along line A-A' of FIG. 3 to illustrate an image sensor according to an embodiment of the inventive concept. FIGS. 8A and 8C are enlarged sectional views, each of which corresponds to a portion 'BB' of FIG. 7.

Figure 8B:
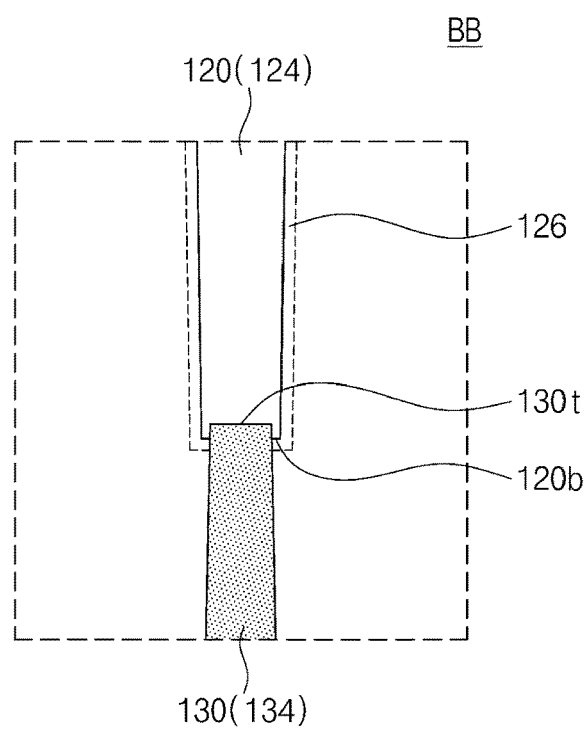

Referring to FIGS. 7, 8A, and 8B, the first isolation structure 120 and the second isolation structure 130 may be in contact with each other. For example, the first and second pixel isolation patterns 122 and 132 may be in contact with each other, and the first and second inner isolation patterns 124 and 134 may be in contact with each other.

In an embodiment, as shown in FIG. 8A, the bottom surface 120b of the first isolation structure 120 may be in contact with the top surface 130t of the second isolation structure 130. A width of the bottom surface 120b of the first isolation structure 120 may be greater than a width of the top surface 130t of the second isolation structure 130. The top surface 130t of the second isolation structure 130 may cover a portion of the bottom surface 120b of the first isolation structure 120. Another portion of the bottom surface 120b of the first isolation structure 120 may be in contact with the barrier region 126. The barrier region 126 may be provided to cover the side surfaces of the first isolation structure 120 and to partially cover an upper portion of the side surface of the second isolation structure 130.

In an embodiment, as shown in FIG. 8B, an upper portion of the second isolation structure 130 may be inserted into the first isolation structure 120. The top surface 130t of the second isolation structure 130 may be positioned at a vertical level that is higher than that of the bottom surface 120b of the first isolation structure 120.

Figure 9:
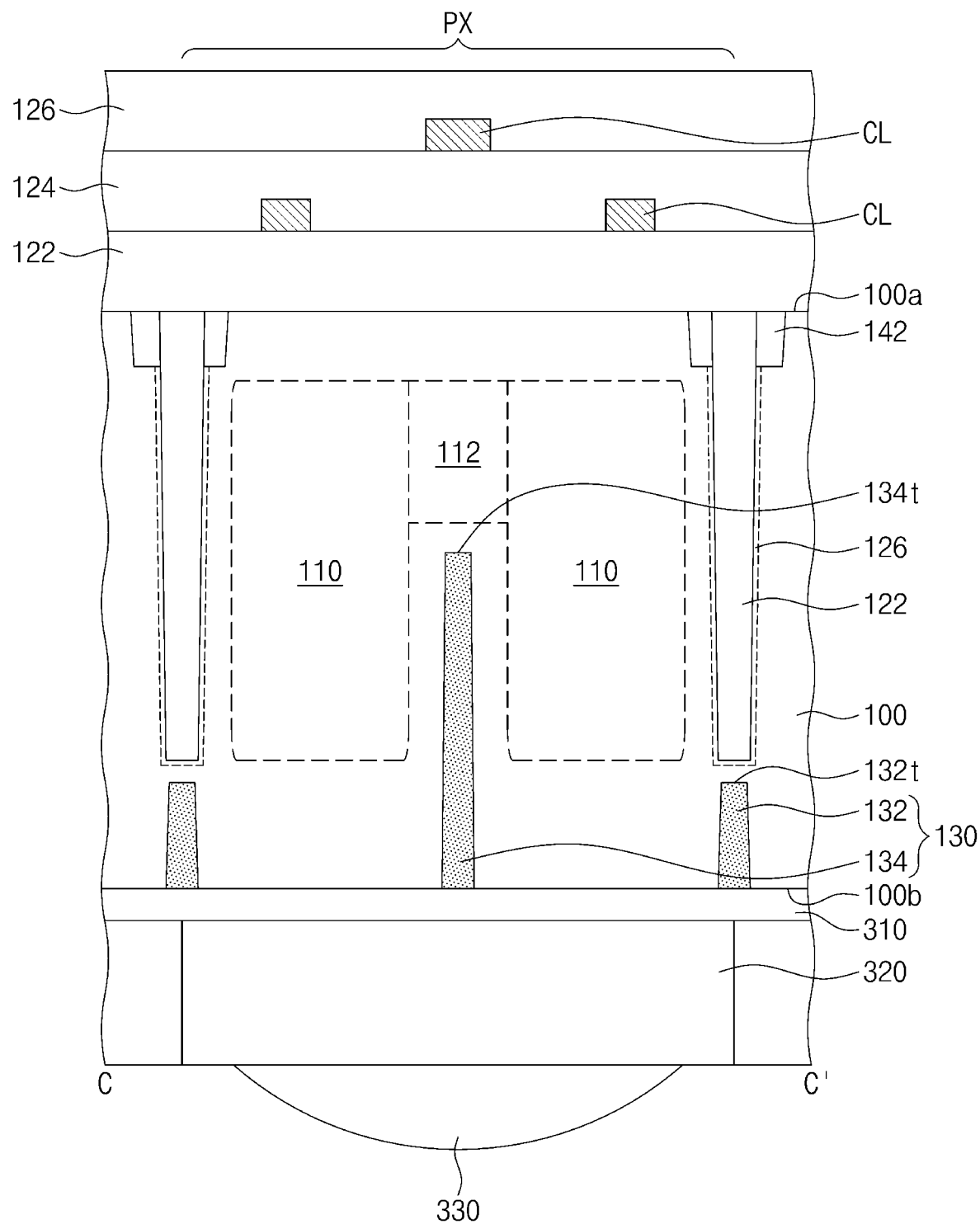
FIG. 9 is a sectional view, which is taken along line C-C' of FIG. 3 to illustrate an image sensor according to an embodiment of the inventive concept.

FIG. 9 is a sectional view, which is taken along line C-C' of FIG. 3 to illustrate an image sensor according to an embodiment of the inventive concept.

Referring to FIG. 9, the second pixel isolation pattern 132 and the second inner isolation pattern 134 of the second isolation structure 130 may be located at different heights. For example, a top surface 134t of the second inner isolation pattern 134 may be closer to the first surface 100a of the semiconductor substrate 100 than a top surface 132t of the second pixel isolation pattern 132. The second inner isolation pattern 134 may be extended toward the connection region 112 connecting the photoelectric conversion regions 110 to each other.

Figure 10A:
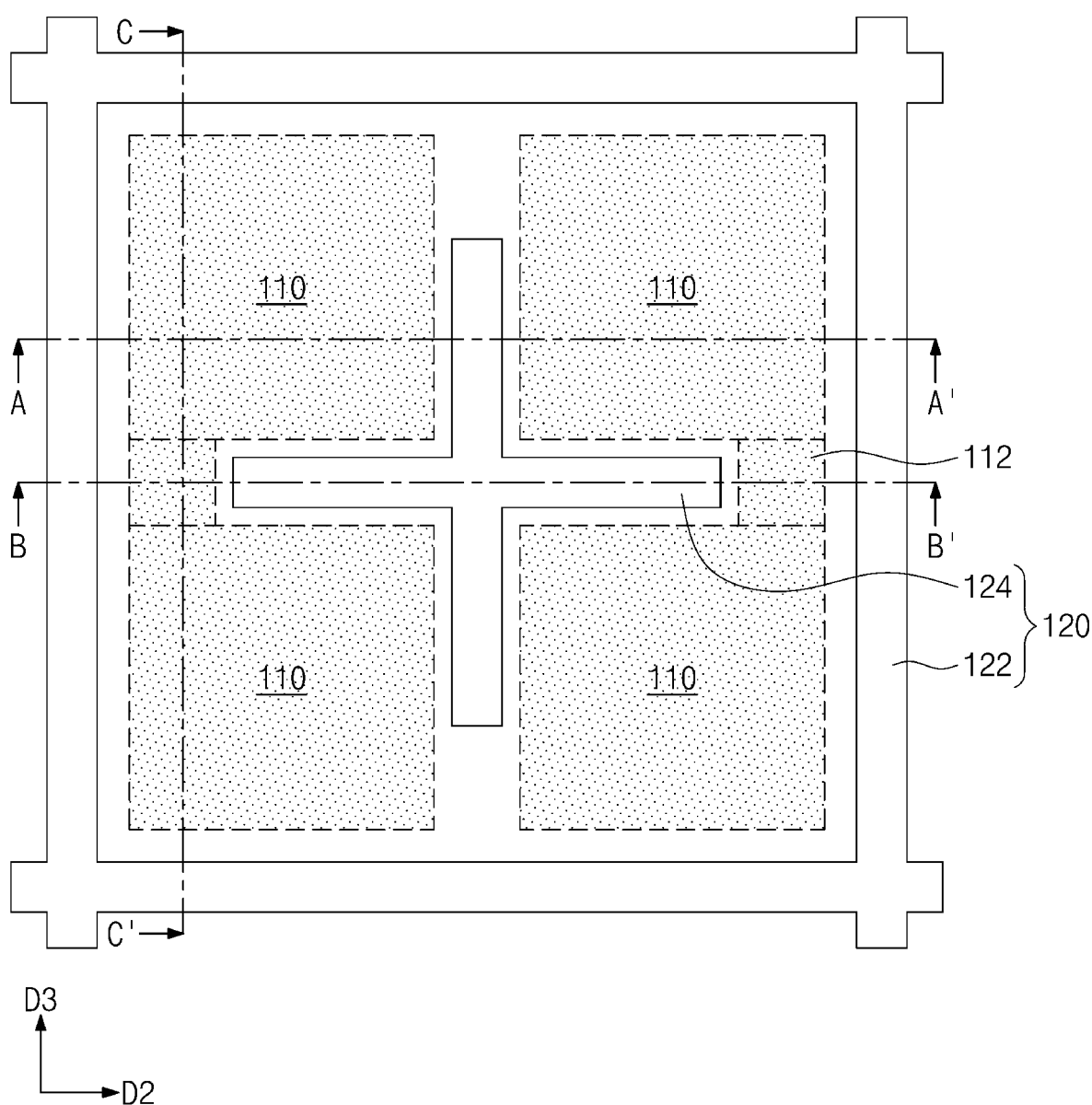
FIGS. 10A and 10B are plan views, each of which illustrates a portion of an image sensor according to an embodiment of the inventive concept.
Figure 10B:
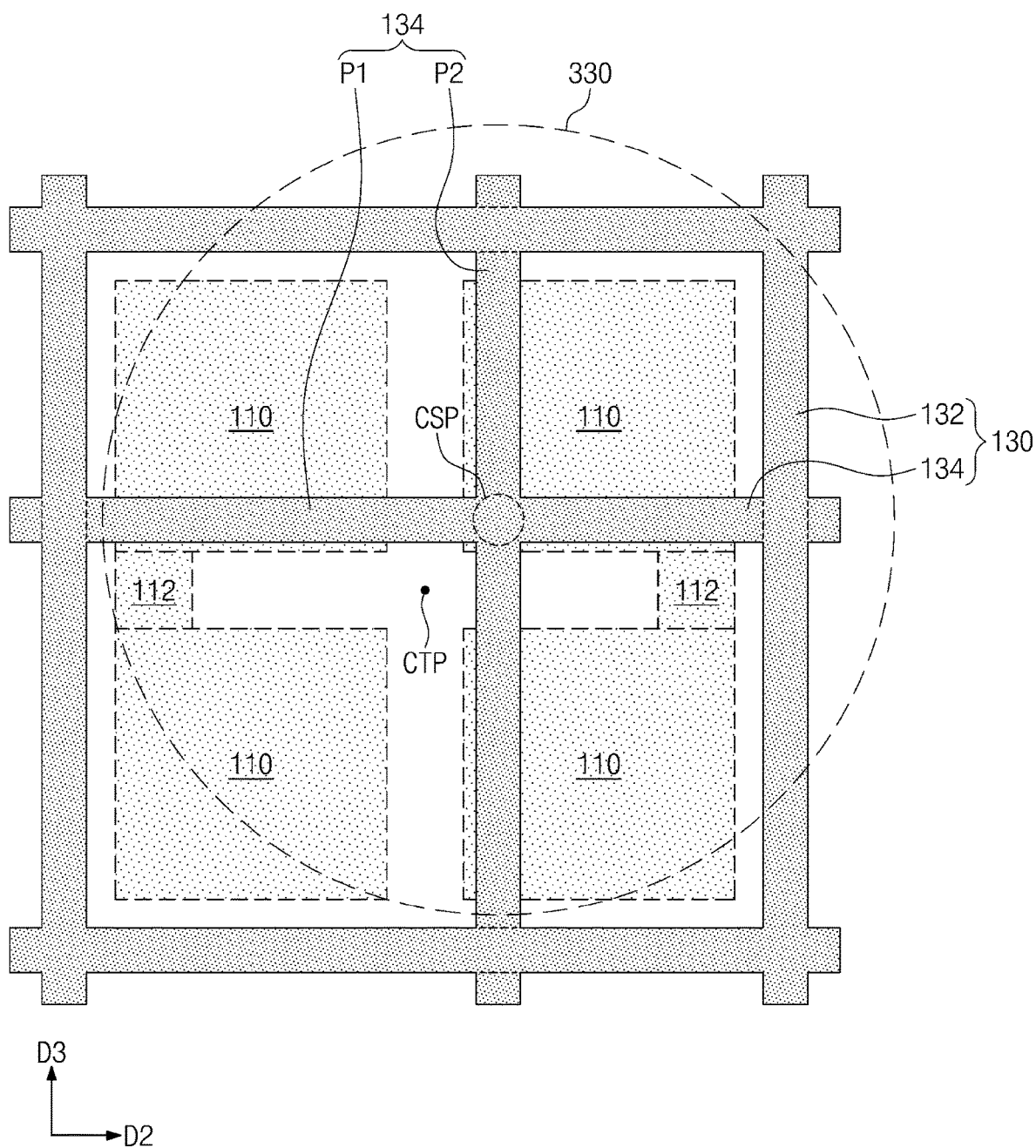
Figure 11A:
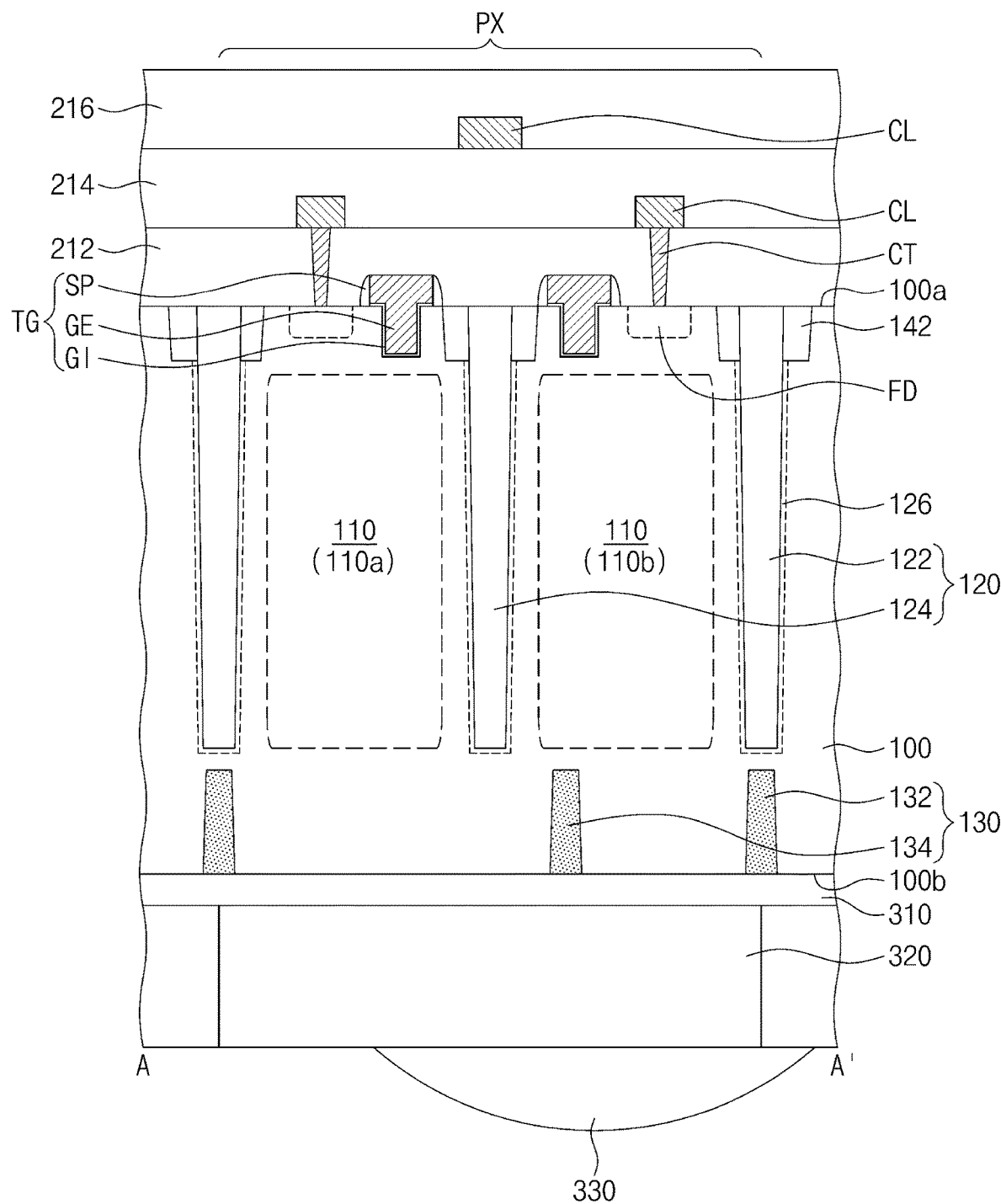
FIGS. 11A to 11C are sectional views, which are respectively taken along lines A-A', B-B', and C-C' of FIG. 10A.
Figure 11B:
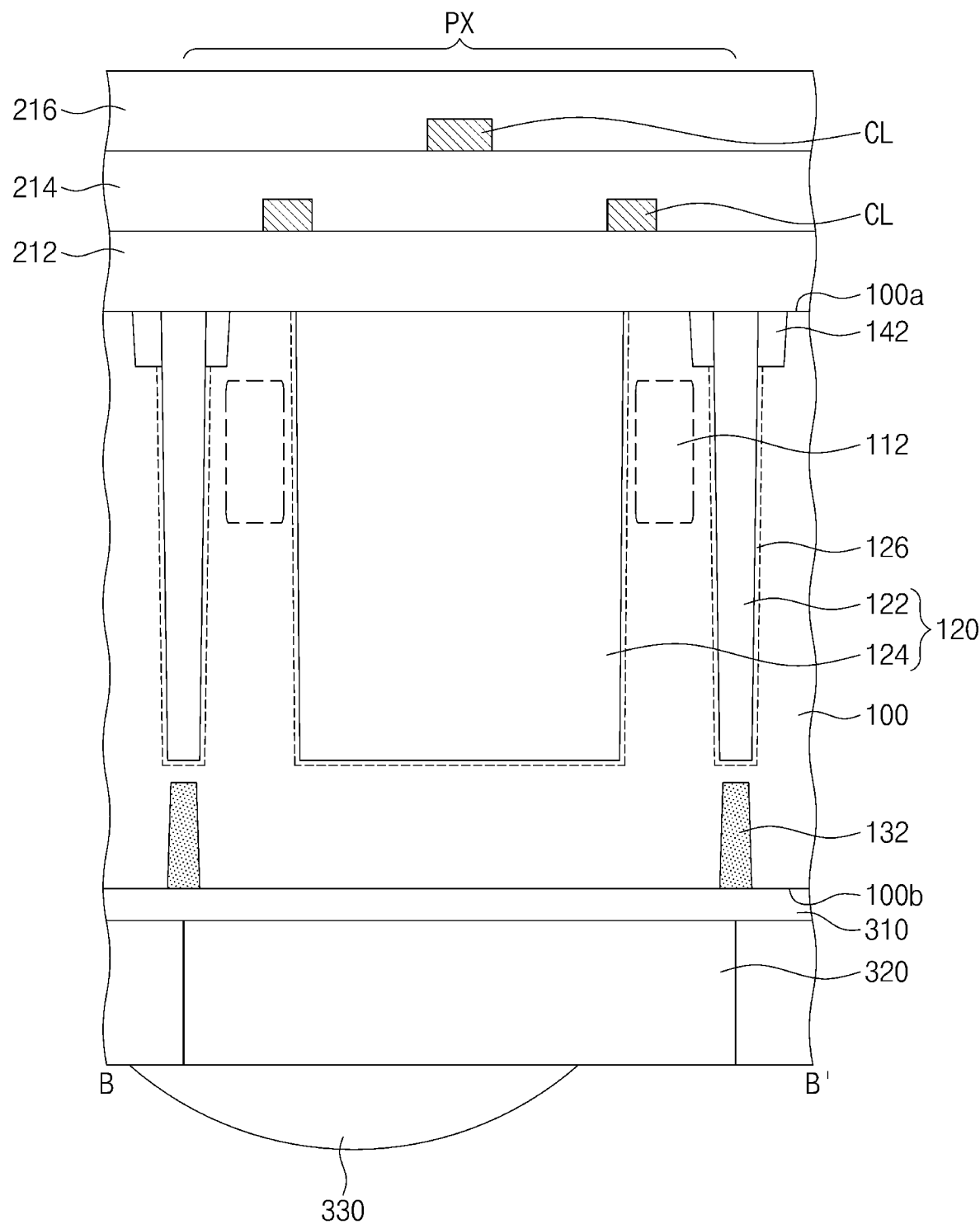
Figure 11C:
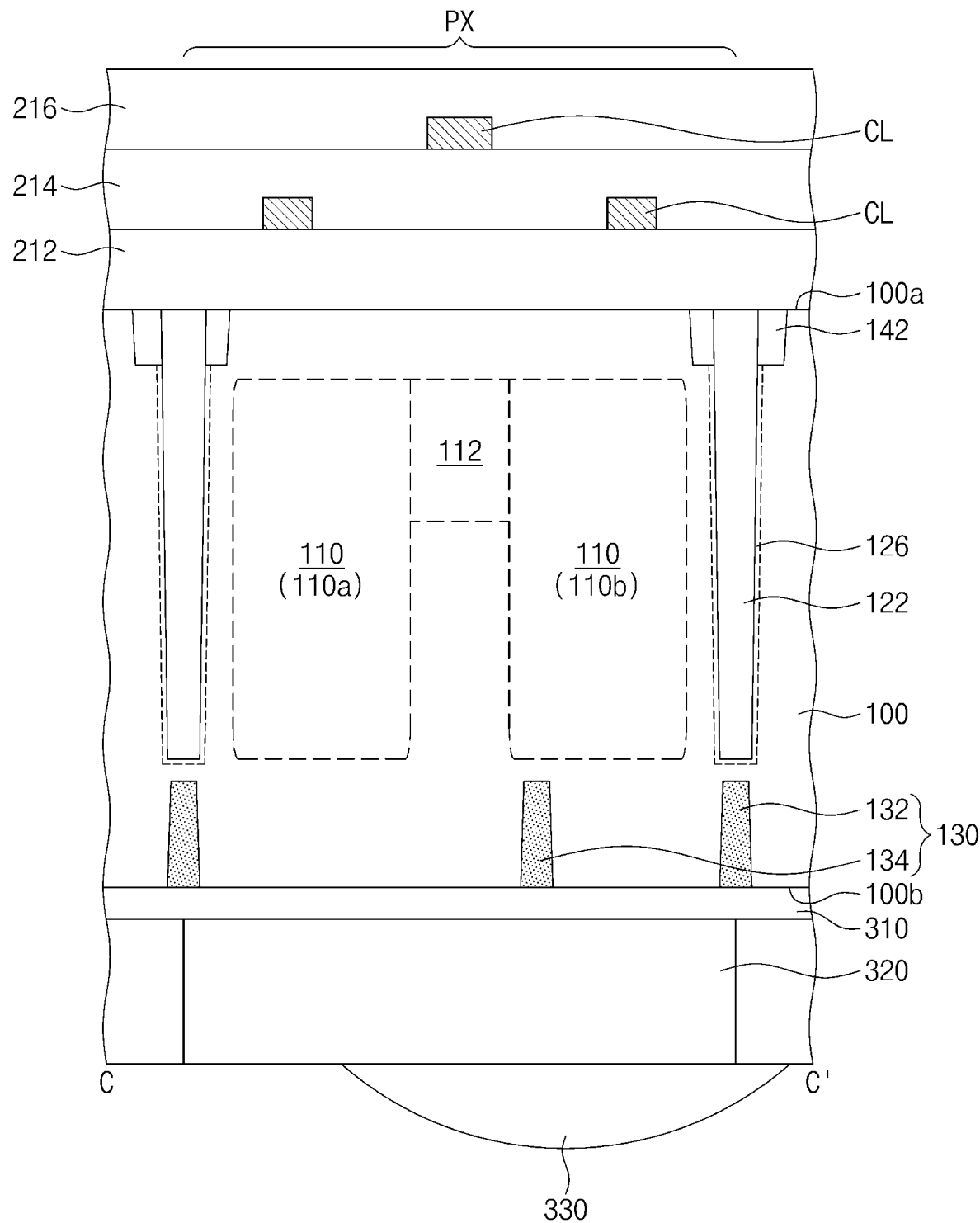

FIGS. 10A and 10B are plan views, each of which illustrates a portion of an image sensor according to an embodiment of the inventive concept. FIGS. 11A to 11C are sectional views, which are respectively taken along lines A-A', B-B', and C-C' of FIG. 10A.

Referring to FIGS. 10A to 11C, the second inner isolation pattern 134 may be shifted from a center CTP of the pixel region PX toward the second pixel isolation pattern 132. For example, the second inner isolation pattern 134 may be shifted in the second and third directions D2 and D3, when compared to the structure of FIG. 5B. By contrast, the photoelectric conversion regions 110 and the connection region 112 may not be shifted. The structure of the pixel region PX according to the present embodiment may be applied to the pixel region PX of a pixel P at the edge region ER, among the pixels P of FIG. 1, but the inventive concept is not limited to this example.

In an embodiment, the second inner isolation pattern 134 may include a first portion P1, which is extended in the second direction D2, and a second portion P2, which is extended in the third direction D3 to cross the first portion P1. An intersection point CSP of the first and second portions P1 and P2 may be spaced apart from the center CTP of the pixel region PX in the second and third directions D2 and D3. Since the second inner isolation pattern 134 is shifted, the second inner isolation pattern 134 may be partially overlapped with the photoelectric conversion regions 110. When viewed in a plan view, the second inner isolation pattern 134 may not be overlapped with the connection region 112, unlike that described with reference to FIG. 4.

In an embodiment, the micro lens 330 may be shifted, along with the second inner isolation pattern 134. When viewed in a plan view, a center of the micro lens 330 may be spaced apart from the center CTP of the pixel region PX. The micro lens 330 may be overlapped with at least two pixel regions adjacent to each other.

Figure 12:
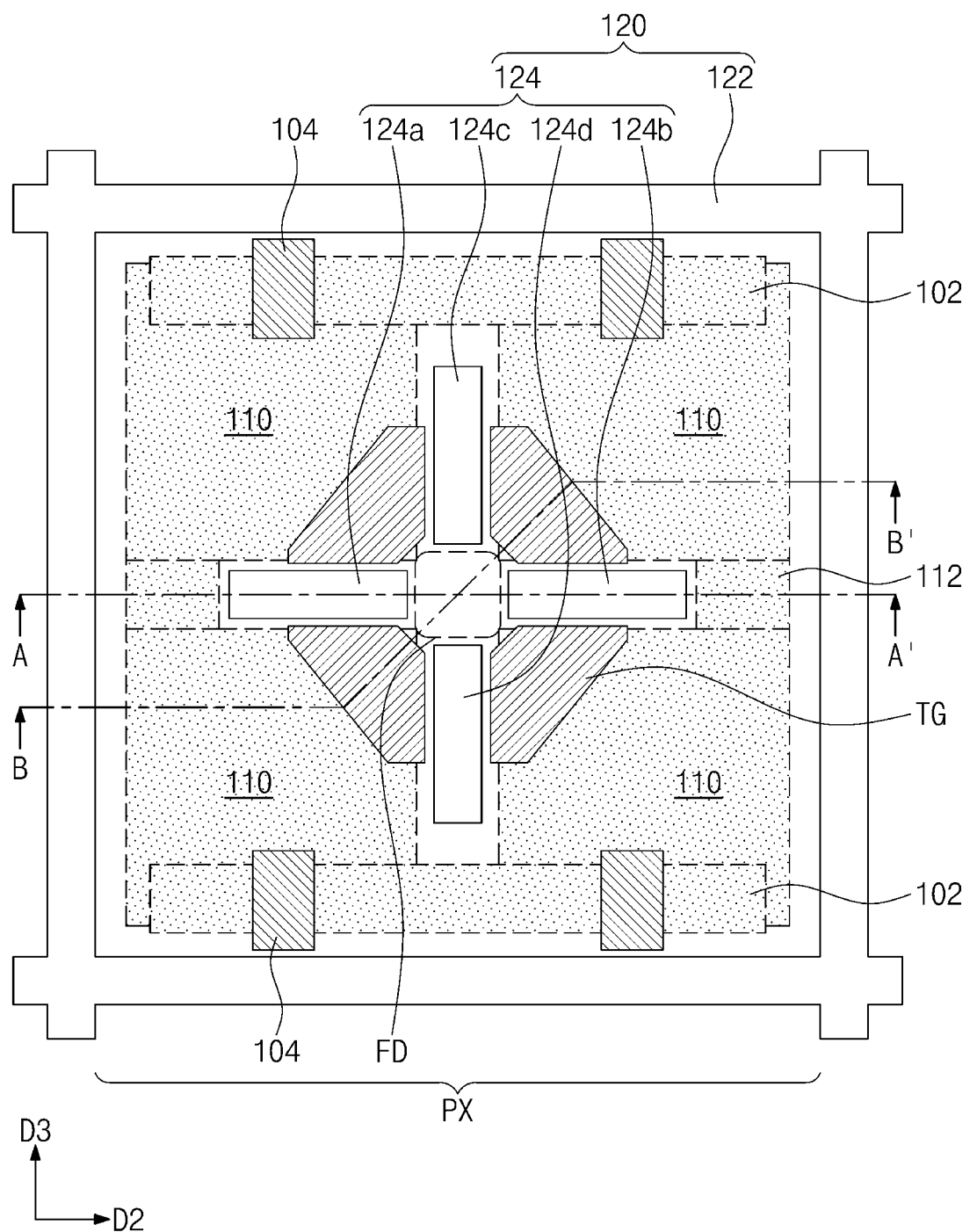
FIG. 12 is a plan view illustrating an image sensor according to an embodiment of the inventive concept.
Figure 13A:
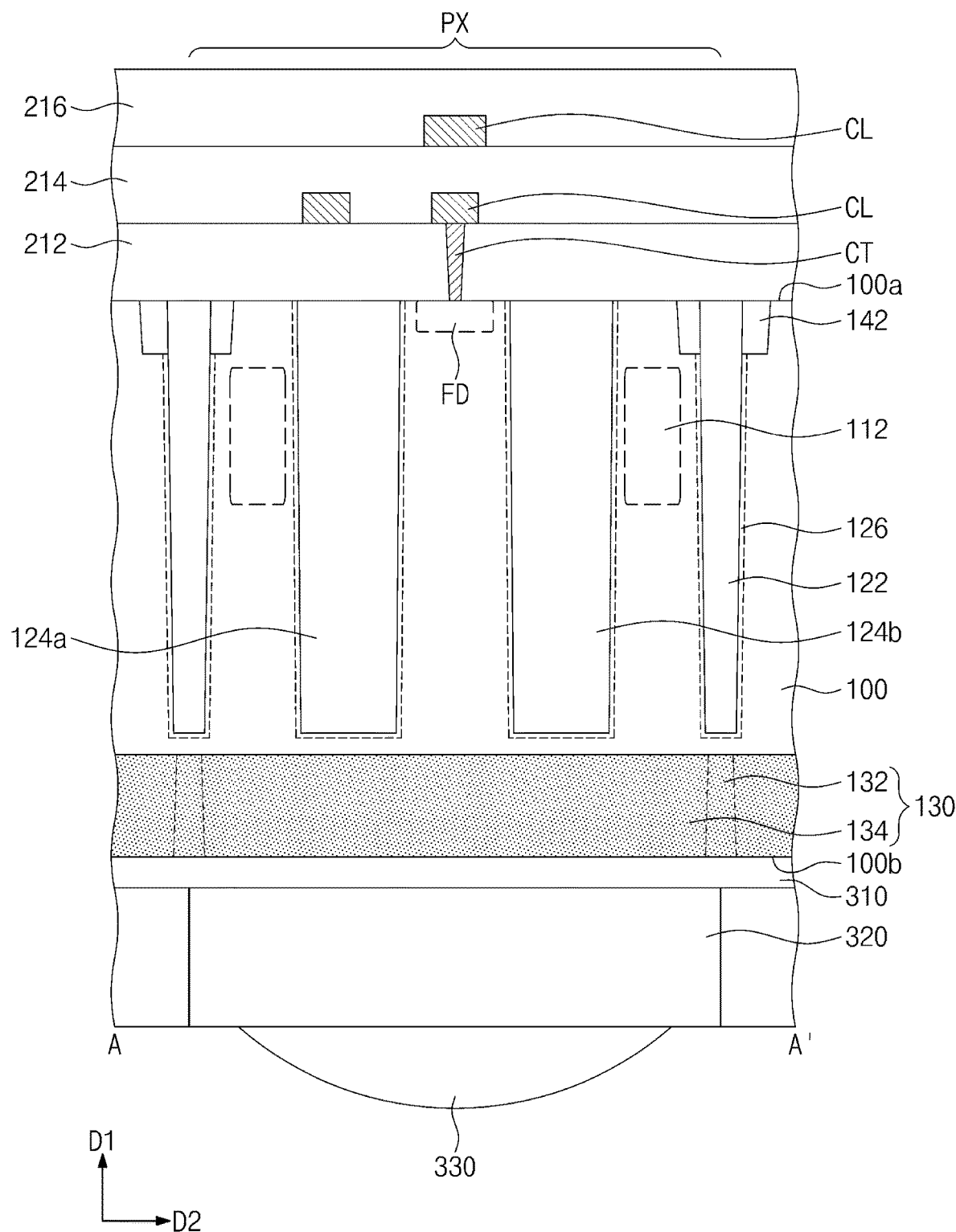
FIGS. 13A and 13B are sectional views, which are taken along lines A-A' and B-B' of FIG. 12.
Figure 13B:
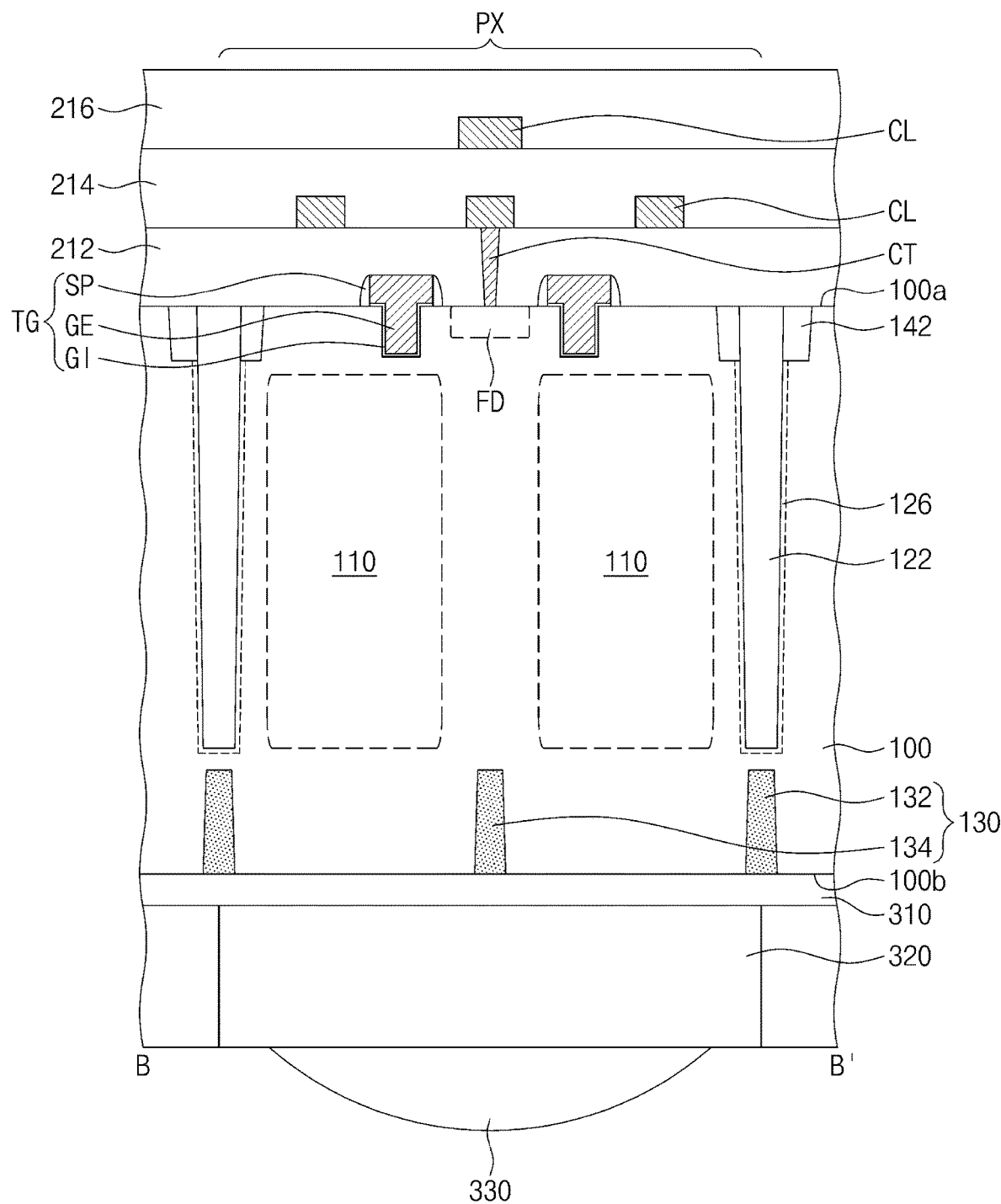

FIG. 12 is a plan view illustrating an image sensor according to an embodiment of the inventive concept. FIGS. 13A and 13B are sectional views, which are taken along lines A-A' and B-B' of FIG. 12.

Referring to FIGS. 12, 13A, and 13B, each of the floating diffusion regions FD may be disposed in a corresponding one of the pixel regions PX. A plurality of photodiodes in the pixel region PX may share one floating diffusion region FD. The floating diffusion region FD may be positioned at a center region of the pixel region PX. The floating diffusion region FD may be provided to be adjacent to all of the gate electrode GES positioned on the photoelectric conversion regions 110, when viewed in a plan view.

In an embodiment, the first inner isolation pattern 124 may include first to fourth portions 124a, 124b, 124c, and 124d, which are disposed near the floating diffusion region FD. The first portion 124a and the second portion 124b may be spaced apart from each other in the second direction D2, and the third portion 124c and the fourth portion 124d may be spaced apart from each other in the third direction D3. The floating diffusion region FD may be positioned between the first portion 124a and the second portion 124b and between the third portion 124c and the fourth portion 124d. The floating diffusion region FD may be overlapped with the second inner isolation pattern 134 of the second isolation structure 130, when viewed in a plan view.

The gate structures TG may be used to transfer electric charges, which are generated in the photoelectric conversion regions 110, to the floating diffusion region FD. The gate structures TG on each of the photoelectric conversion regions 110 may be applied with signals, which have turn-on periods that do not overlap each other. For example, the photodiodes in the pixel region PX may sequentially transfer electric charges to the floating diffusion region FD.

FIGS. 14, 16, 18, and 21 are plan views illustrating a method of fabricating an image sensor, according to an embodiment of the inventive concept. FIGS. 15, 17, 19, 20, and 22 are sectional views, which are respectively taken along lines A-A' of FIGS. 14, 16, 18, and 21 to illustrate a method of fabricating an image sensor according to an embodiment of the inventive concept.

Figure 14:
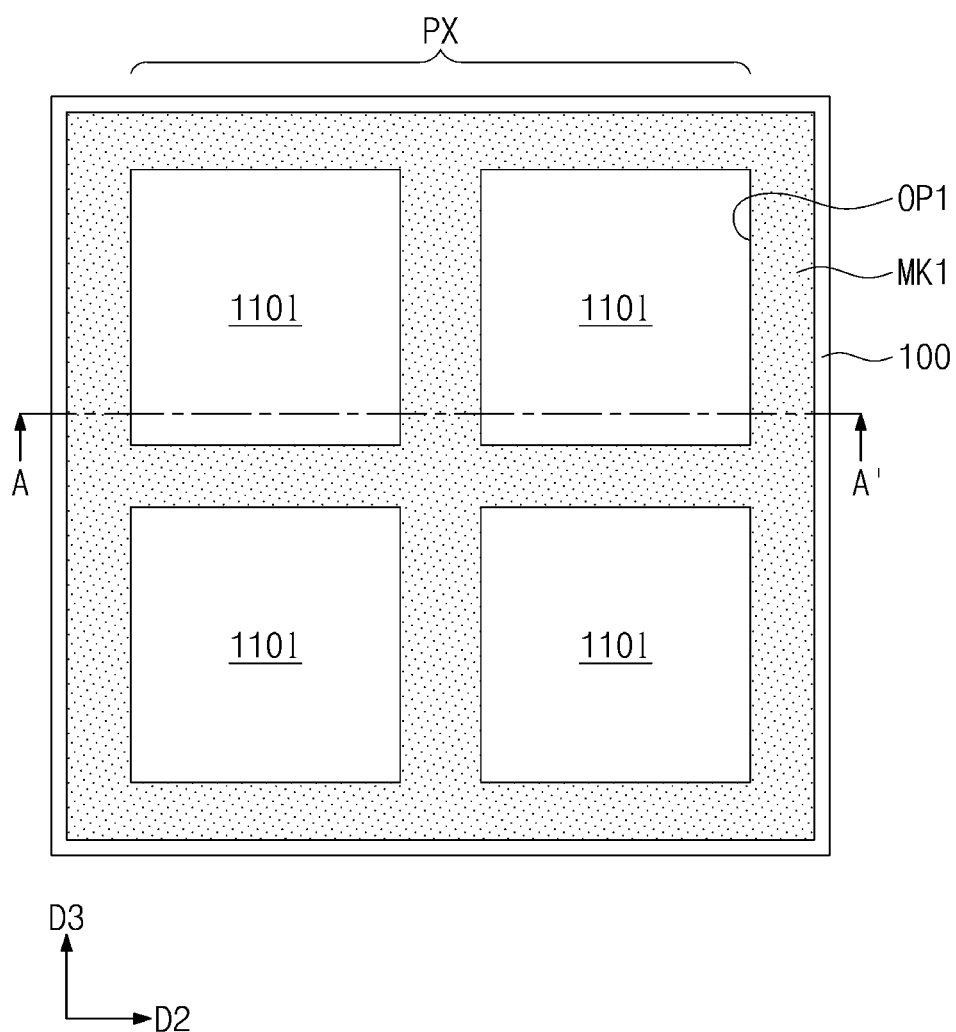
FIGS. 14, 16, 18, and 21 are plan views illustrating a method of fabricating an image sensor, according to an embodiment of the inventive concept.
Figure 15:
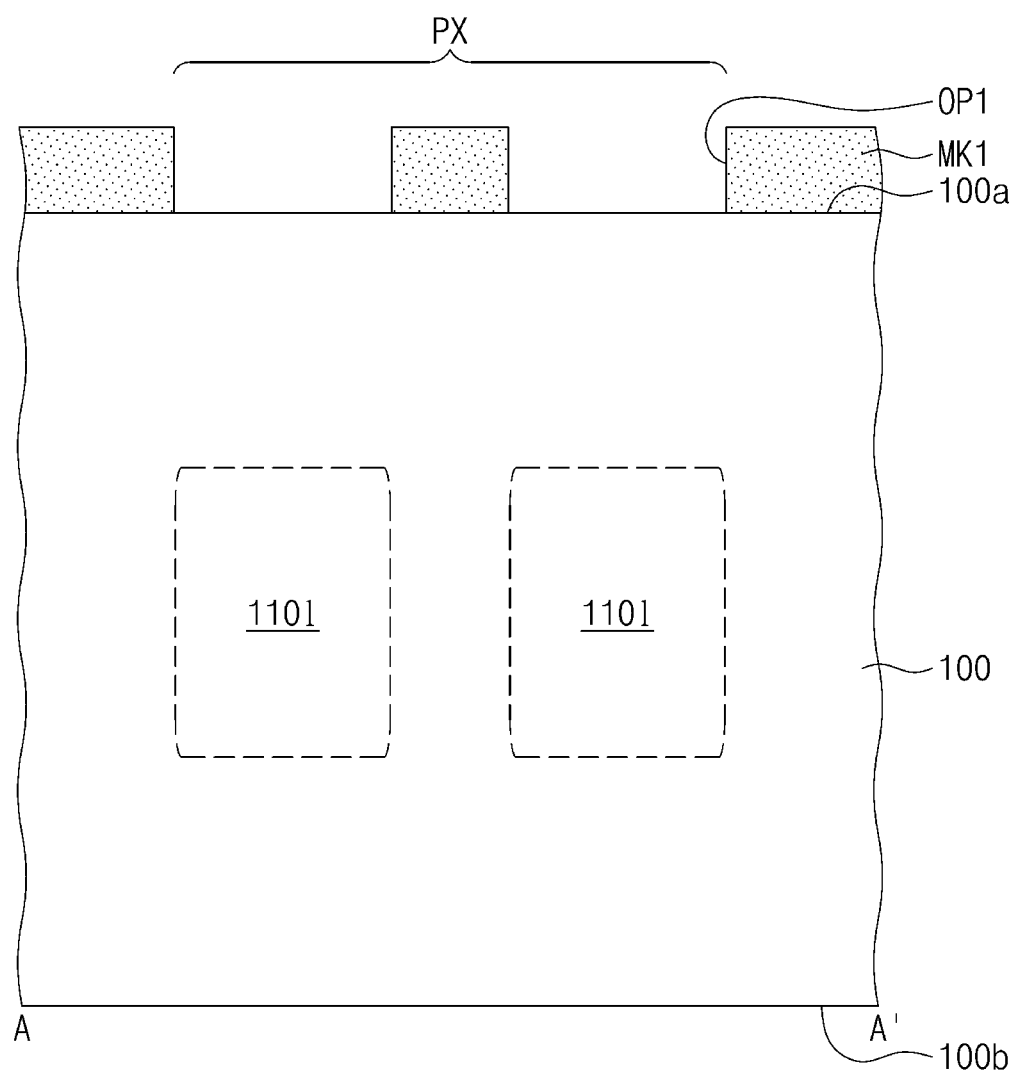
FIGS. 15, 17, 19, 20, and 22 are sectional views, which are respectively taken along lines A-A' of FIGS. 14, 16, 18, and 21 to illustrate a method of fabricating an image sensor according to an embodiment of the inventive concept.

Referring to FIGS. 14 and 15, the semiconductor substrate 100 of the first conductivity type (e.g., p-type) may be provided. The semiconductor substrate 100 may have the first and second surfaces 100a and 100b that are opposite to each other. The semiconductor substrate 100 may include the pixel region PX.

A first mask pattern MK1 may be formed on the first surface 100a of the semiconductor substrate 100 to expose the pixel region PX. The first mask pattern MK1 may include a plurality of first openings OP1, each of which exposes a portion of the pixel region PX. Next, a lower doped region 110l may be formed in the pixel region PX. The lower doped region 110l may be formed by performing a first ion implantation process on the first surface 100a of the semiconductor substrate 100 using the first mask pattern MK1. The first ion implantation process may include injecting the second conductivity type impurities (e.g., of n-type) into the first surface 100a of the semiconductor substrate 100. The impurities injected into the semiconductor substrate 100 may be located at various depths, depending on their kinetic energy. In the case where the impurities are accelerated with high energy, the impurities may be injected to a level that is close to the second surface 100b of the semiconductor substrate 100. In an embodiment, the first ion implantation process may be performed with various energies to inject the impurities to various depths.

The first mask pattern MK1 may include the first openings OP1, each of which exposes a portion of the pixel region PX, as shown in FIG. 14. Thus, a plurality of lower doped regions 110l may be formed in the pixel region PX.

Figure 16:
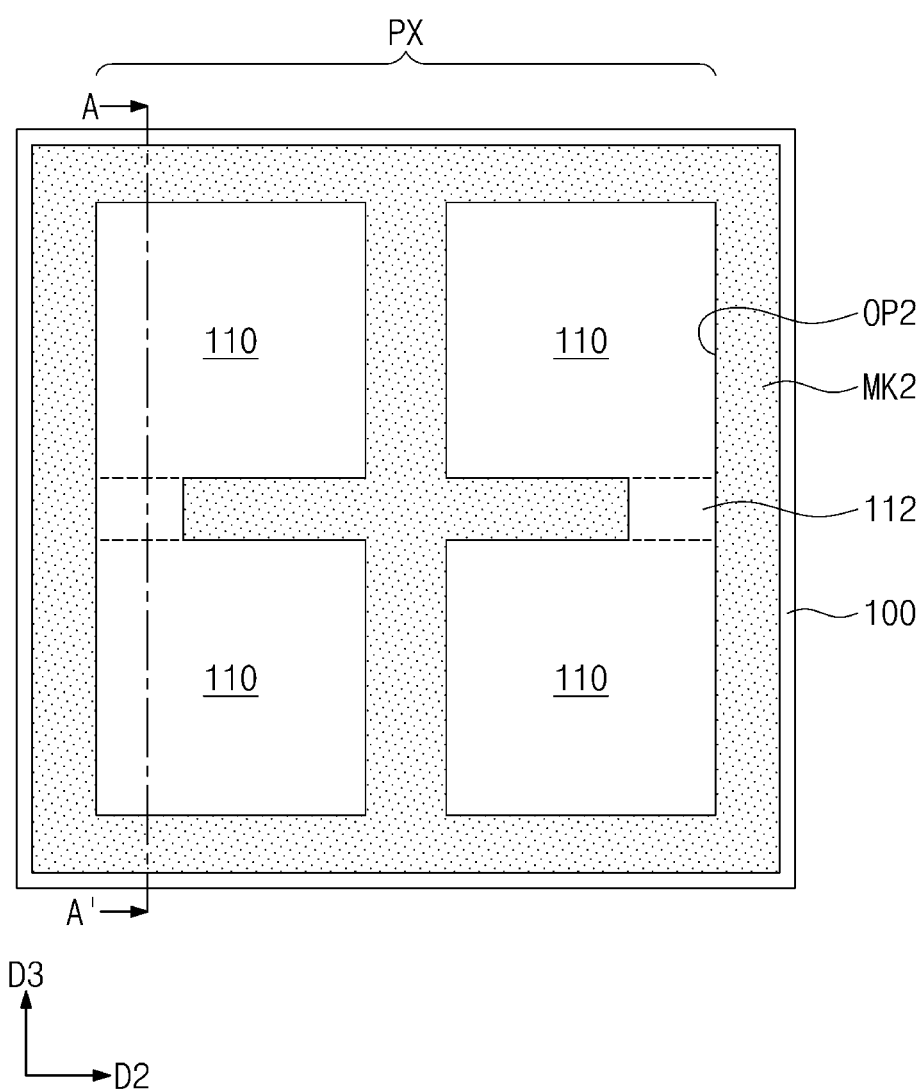
Figure 17:
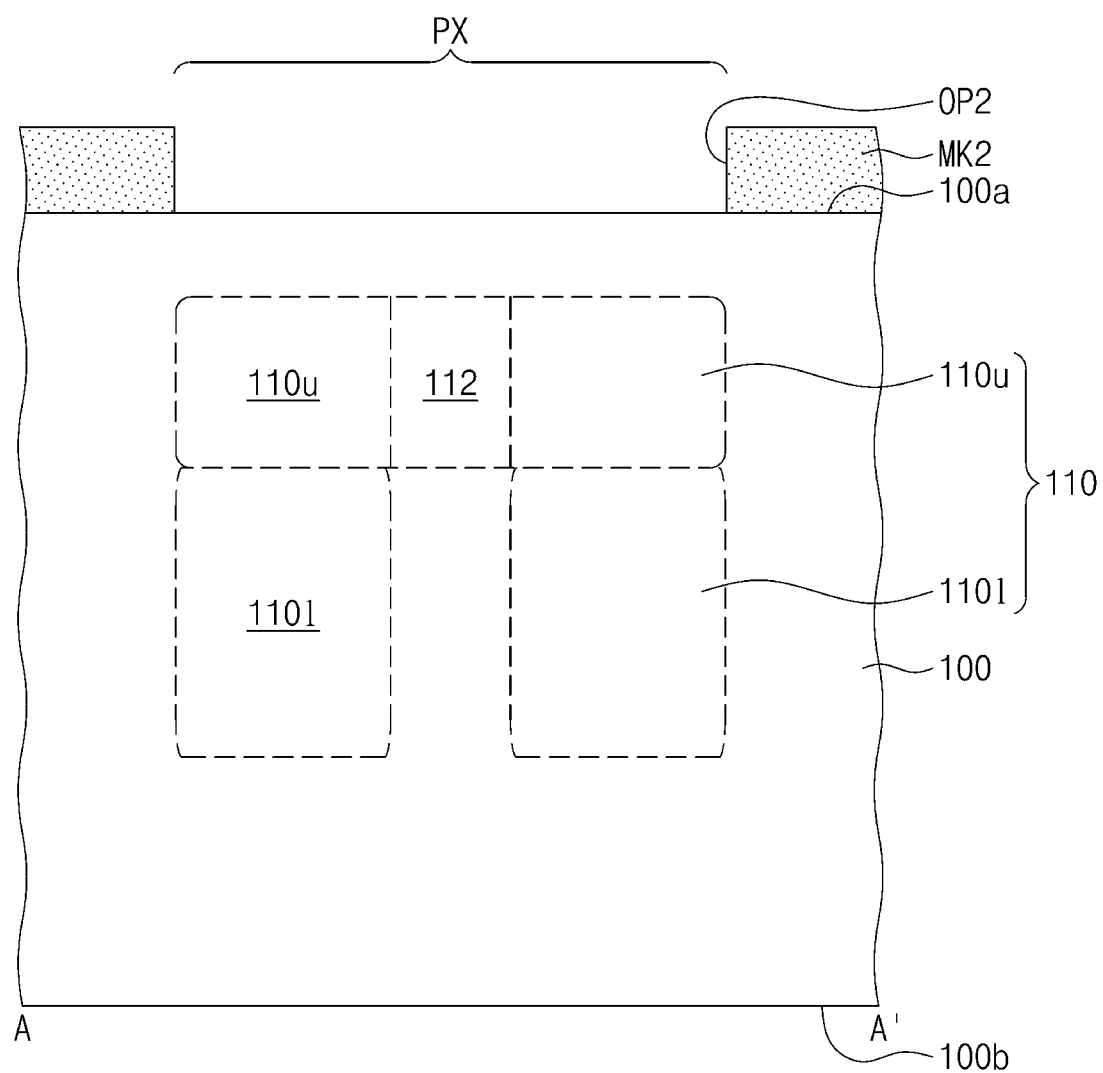

Referring to FIGS. 16 and 17, a second mask pattern MK2 may be formed on the first surface 100a of the semiconductor substrate 100. In an embodiment, the first mask pattern MK1 may be removed, before the formation of the second mask pattern MK2. The second mask pattern MK2 may include one second opening OP2 exposing the pixel region PX, unlike the first mask pattern MK1.

Next, an upper doped region 110u and the connection region 112 may be formed in the pixel region PX. The upper doped region 110u and the connection region 112 may be formed by performing a second ion implantation process on the first surface 100a of the semiconductor substrate 100 using the second mask pattern MK2. The second ion implantation process may include injecting the second conductivity type (e.g., n-type) impurities into the semiconductor substrate 100 through the first surface 100a. In an embodiment, the second ion implantation process may be performed under an ion energy that is lower than that in the first ion implantation process. Accordingly, the upper doped region 110u and the connection region 112 may be formed to be closer to the first surface 100a of the semiconductor substrate 100 than the lower doped region 110l. The lower doped region 110l and the upper doped region 110u may be vertically connected to each other to constitute the photoelectric conversion region 110. The connection region 112 between the upper doped regions 110u may connect the photoelectric conversion regions 110 to each other. For example, the connection region 112 may connect two photoelectric conversion regions 110 spaced apart from each other in the third direction D3. In an embodiment, no connection region is disposed between two photoelectric conversion regions 110 spaced apart from each other in the second direction D2. The present inventive concept is not limited thereto. In an embodiment, a connection region may also be formed between two adjacent photoelectric conversion in the second direction D2 to connect them to each other.

The upper doped region 110u and the connection region 112 may be simultaneously formed by the second ion implantation process. In an embodiment, when measured at the same vertical level, the upper doped region 110u and the connection region 112 may have the same concentration of the second conductivity type impurities.

Figure 18:
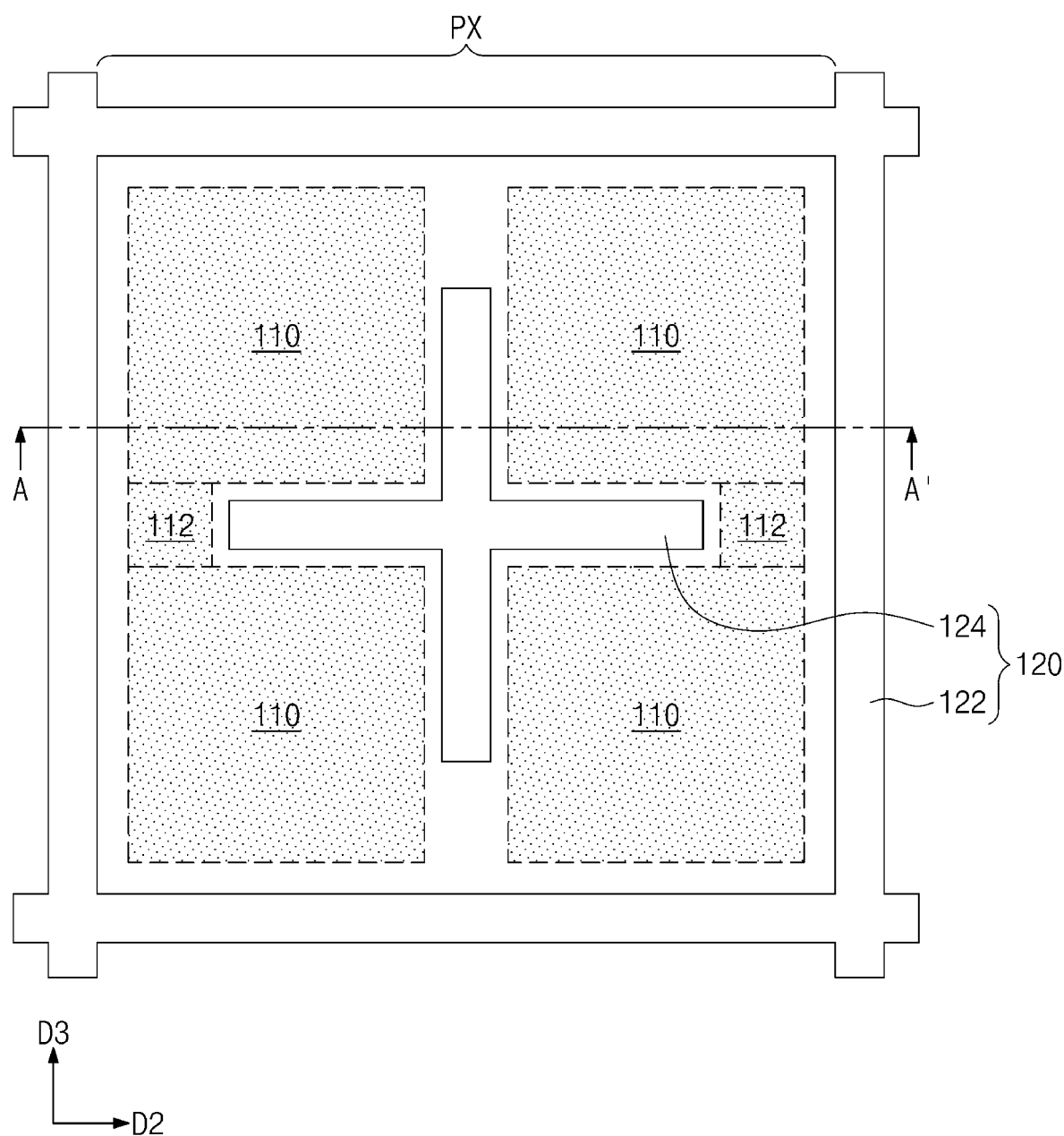
Figure 19:
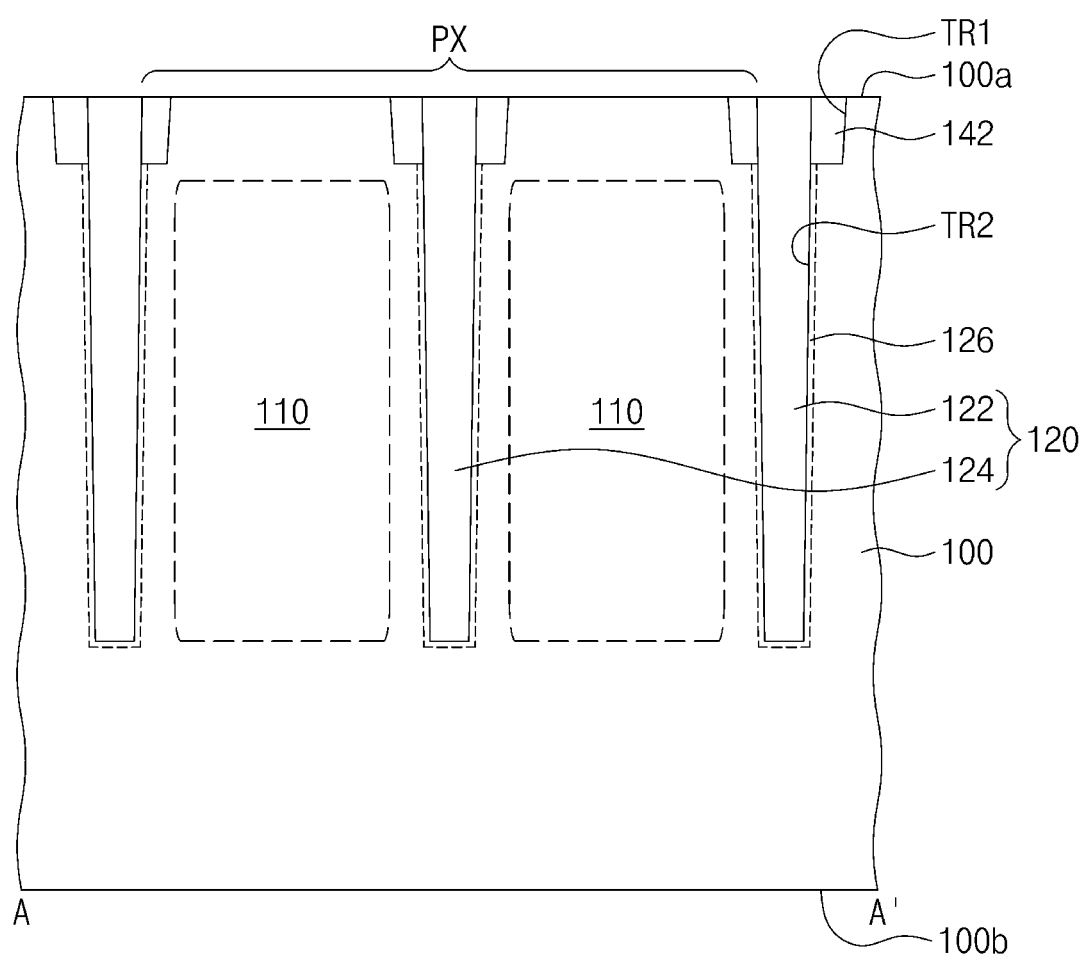

Referring to FIGS. 18 and 19, the first isolation structure 120 and the device isolation layer 142 may be formed in the semiconductor substrate 100. The first isolation structure 120 and the device isolation layer 142 may be adjacent to the first surface 100a of the semiconductor substrate 100. The device isolation layer 142 may be formed in a first trench TR1, which is provided in the semiconductor substrate 100 and adjacent to the first surface 100a. The first isolation structure 120 may be formed in a second trench TR2, which is overlapped with the first trench TR1 and is deeper than the first trench TR1.

The first trench TR1 and the second trench TR2 may be formed by anisotropically etching the semiconductor substrate 100 using a mask pattern as an etch mask. Since, during the formation of the first and second trenches TR1 and TR2, the semiconductor substrate 100 is anisotropically etched through the first surface 100a, the first and second trenches TR1 and TR2 may have widths gradually decreasing with increasing depth from the first surface 100a toward the second surface 100b. Accordingly, the device isolation layer 142 and the first isolation structure 120, which fill the first and second trenches TR1 and TR2, respectively, may have widths gradually decreasing with increasing depth from the first surface 100a toward the second surface 100b.

A planarization process may be performed to remove a portion of the semiconductor substrate 100 or to reduce a vertical thickness of the semiconductor substrate 100. As a result of the planarization process, the first isolation structure 120 and the device isolation layer 142 may have top surfaces that are coplanar with each other.

Figure 20:
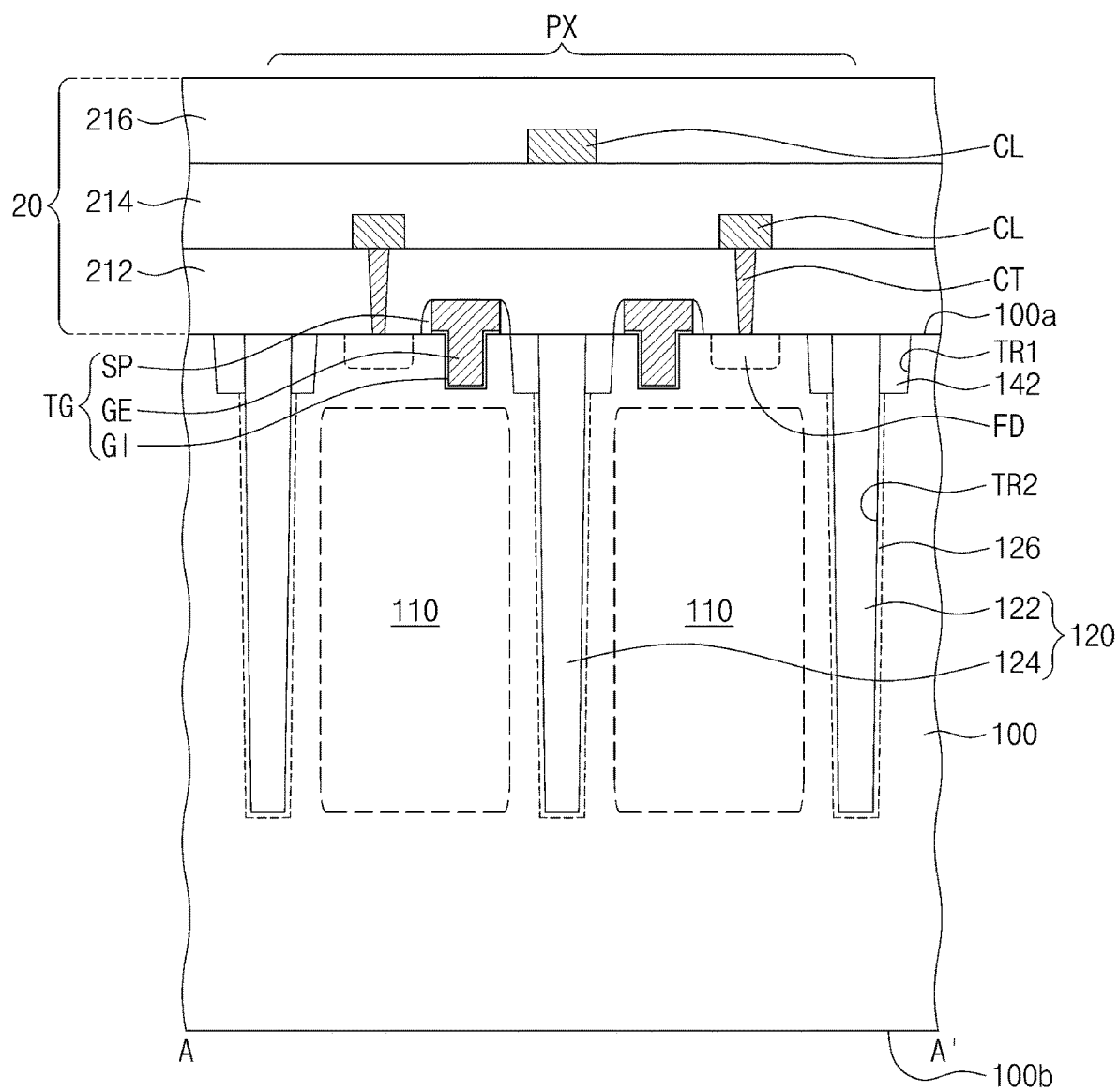

Referring to FIG. 20, the gate structure TG may be formed on the first surface 100a of the semiconductor substrate 100. The formation of the gate structure TG may include patterning the first surface 100a of the semiconductor substrate 100 to form gate recess regions, forming the gate insulating layer GI to conformally cover inner surfaces of the gate recess regions, forming a gate conductive layer to fill the gate recess regions, patterning the gate conductive layer to form the gate electrode GE, and forming the gate spacers SP on side surfaces of the gate electrode GE. In an embodiment, the gate electrodes of the read-out circuits may be formed, along with the gate structure TG, when the gate structure TG are formed.

The floating diffusion region FD may be formed in the semiconductor substrate 100 and adjacent to the gate structure TG. The floating diffusion region FD may be formed by injecting second conductivity type impurities into the semiconductor substrate 100. In an embodiment, source/drain regions of the logic transistors may be formed along with the floating diffusion region FD, when the floating diffusion region FD is formed.

Next, the interlayered insulating layers 212, 214, and 216 may be formed on the first surface 100a of the semiconductor substrate 100 to cover the gate structures TG and the logic transistors. At least one of the interlayered insulating layers 212, 214, and 216 may be formed of a material having a good gap-fill property and may have a flat top surface. For example, at least one of the interlayered insulating layers may be formed of or include at least one of High Density Plasma (HDP) oxide, Tonen SilaZene (TOSZ), Spin-On-Glass (SOG), Undoped Silica Glass (USG), and so forth.

The contact plugs CT and the connection lines CL may be formed in the interlayered insulating layers 212, 214, and 216, and the contact plugs CT may be coupled to the floating diffusion region FD, and the connection lines CL may be connected to the contact plugs CT. The contact plugs CT and the connection lines CL may be formed of or include at least one of copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or alloys thereof.

Figure 21:
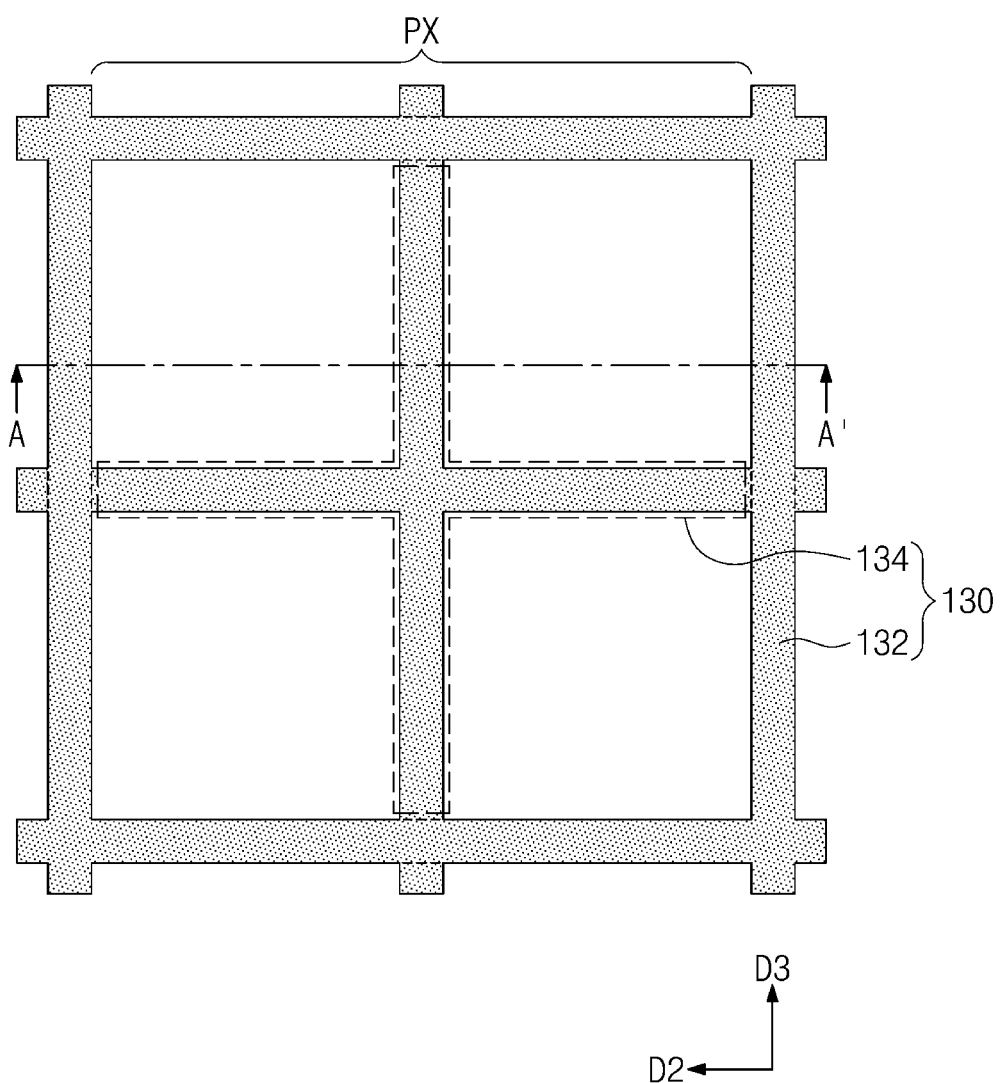
Figure 22:
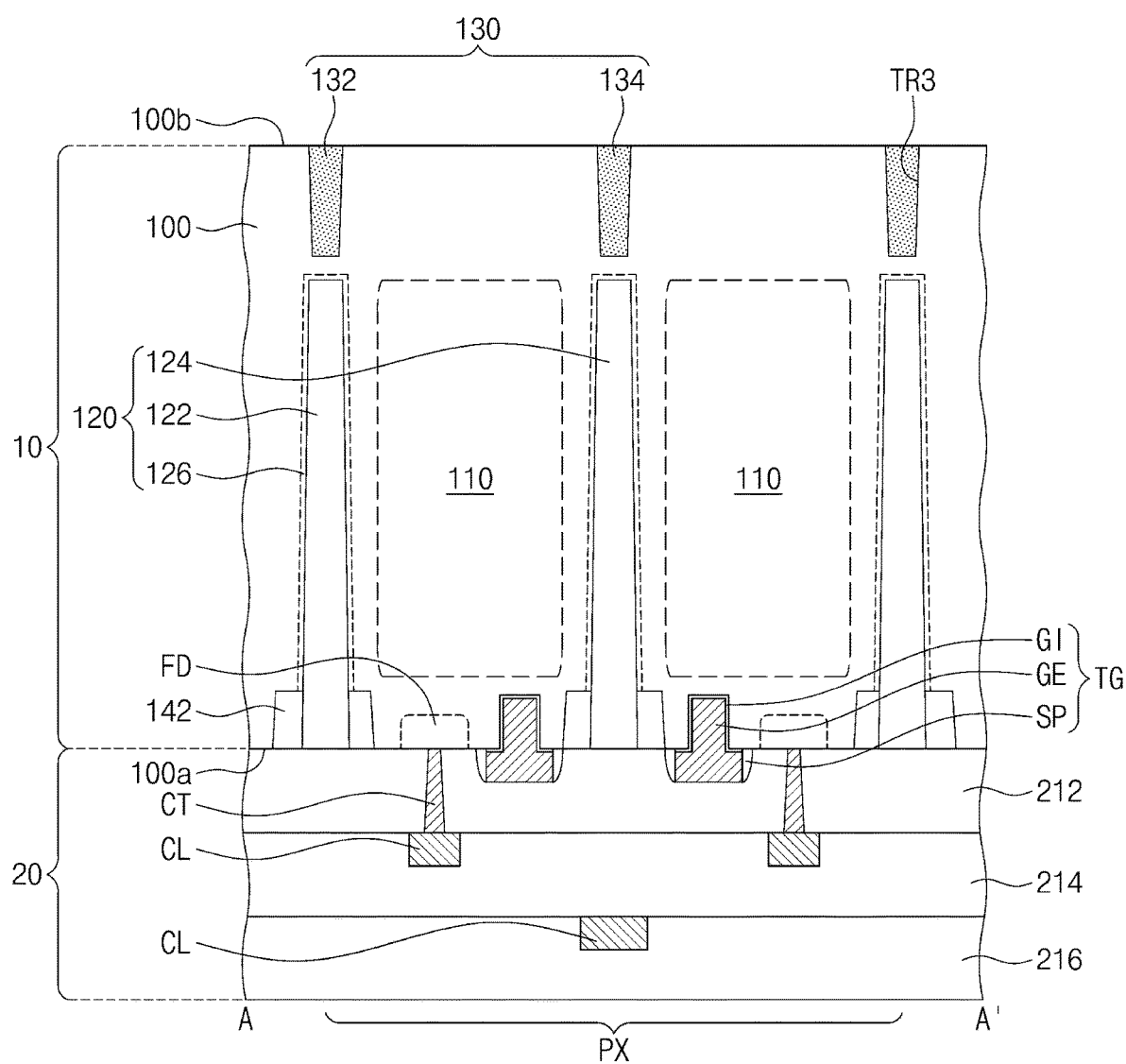

Referring to FIGS. 21 and 22, the second isolation structure 130 may be formed on the second surface 100b of the semiconductor substrate 100. A process of thinning the semiconductor substrate 100 may be performed before the formation of the second isolation structure 130. The thinning process may include grinding or polishing the second surface 100b of the semiconductor substrate 100 and anisotropically or isotropically etching the semiconductor substrate 100. The semiconductor substrate 100 may be inverted, for the thinning process. A portion of the semiconductor substrate 100 may be removed by the grinding or polishing process.

Next, the second surface 100b of the semiconductor substrate 100 may be patterned to form a third trench TR3. The third trench TR3 may be overlapped with the first isolation structure 120, when viewed in a plan view. The second isolation structure 130 may be formed in the third trench TR3. The second isolation structure 130 may be formed to fully fill the third trench TR3. The formation of the third trench TR3 may include forming a mask pattern (not shown) on the second surface 100b of the semiconductor substrate 100 and anisotropically etching the semiconductor substrate 100 using a mask pattern as an etch mask. Since, during the formation of the third trench TR3, the semiconductor substrate 100 is anisotropically etched through the second surface 100b, the third trench TR3 may have a width gradually decreasing with increasing depth from the second surface 100b of the semiconductor substrate 100 toward the first surface 100a thereof. Accordingly, the second isolation structure 130 filling the third trench TR3 may also have a width gradually decreasing with increasing depth from the second surface 100b toward the first surface 100a.

Referring back to FIG. 4A, the buffer insulating layer 310, a color filter layer 220, and micro lenses 230 may be formed on the second surface 100b of the semiconductor substrate 100.

According to an embodiment of the inventive concept, an image sensor having improved electric and optical characteristics may be provided.

While example embodiments of the inventive concepts have been particularly shown and described, it will be understood by one of ordinary skill in the art that variations in form and detail may be made therein without departing from the spirit and scope of the attached claims.

What is claimed is:

1. An image sensor, comprising:
  a semiconductor substrate having a first surface and a second surface, the semiconductor substrate comprising a pixel region with a plurality of photoelectric conversion regions;
  a gate electrode disposed on the pixel region and adjacent to the first surface;
  a first isolation structure extending from the first surface toward the second surface, the first isolation structure comprising a first pixel isolation pattern, which encloses the pixel region, and a first inner isolation pattern, which, when viewed in a plan view, is spaced apart from the first pixel isolation pattern in a first direction and a second direction, the second direction being perpendicular to the first direction, and is positioned between the plurality of photoelectric conversion regions; and a second isolation structure extending from the second surface toward the first surface, the second isolation structure having a top surface vertically spaced apart from at least a portion of a bottom surface of the first isolation structure, wherein the bottom surface of the first isolation structure is closer to the second surface of the semiconductor substrate than to the first surface thereof.

2. The image sensor of claim 1, wherein the pixel region comprises a connection region, which is provided between the first pixel isolation pattern and the first inner isolation pattern to connect two adjacent photoelectric conversion regions of the plurality of photoelectric conversion regions, and wherein the photoelectric conversion regions include impurities that have a first conductivity type, and the connection region comprises impurities, which are of the same first conductivity type as the impurities of the photoelectric conversion regions.

3. The image sensor of claim 2, wherein the connection region is positioned at a vertical level between top and bottom surfaces of the first inner isolation pattern.

4. The image sensor of claim 2, wherein the connection region is vertically overlapped with the second isolation structure.

5. The image sensor of claim 1, wherein the first pixel isolation pattern and the second isolation structure are vertically spaced apart from each other.

6. The image sensor of claim 1, wherein the pixel region of the semiconductor substrate comprises first impurities of a first conductivity type, wherein the photoelectric conversion regions comprises second impurities of a second conductivity type different from the first conductivity type, and wherein a concentration of the first impurities in the pixel region is higher than a concentration of the second impurities, when measured at the same vertical level from the second surface of the semiconductor substrate toward the first surface.

7. The image sensor of claim 1, wherein the first isolation structure comprises a first gapfill pattern and a second gapfill pattern, which is disposed between the first gapfill pattern and the semiconductor substrate, and wherein the first gapfill pattern has a refractive index different from that of the second gapfill pattern.

8. The image sensor of claim 1, wherein the second isolation structure comprises a second pixel isolation pattern, which encloses the pixel region, and a second inner isolation pattern, which is connected to the second pixel isolation pattern and is positioned in the pixel region.

9. The image sensor of claim 8, wherein the second inner isolation pattern comprises a first pattern, which is extended parallel to the second surface, and a second pattern, which is provided to cross the first pattern.

10. The image sensor of claim 1, further comprising:

a barrier region provided in the semiconductor substrate to cover side surfaces of the first isolation structure, wherein the photoelectric conversion regions comprise impurities of a first conductivity type, and wherein the barrier region comprises impurities of a second conductivity type different from the first conductivity type.

11. The image sensor of claim 1, wherein the first isolation structure has a width decreasing in a direction toward the second surface, and wherein the second isolation structure has a width decreasing in a direction toward the first surface.

12. The image sensor of claim 1, further comprising:

a read-out circuit layer, which is disposed on the first surface and includes a connection line electrically connected to the gate electrode; and a micro lens on the second surface.

13. An image sensor, comprising:

a semiconductor substrate of a first conductivity type, the semiconductor substrate having a first surface and a second surface opposite each other and comprising a plurality of pixel regions;

a first pixel isolation pattern disposed in the semiconductor substrate to electrically separate a first pixel region, which is one of the plurality of pixel regions, from the others of the plurality of pixel regions;

first and second photoelectric conversion regions, which are provided in the first pixel region and include impurities of a second conductivity type different from the first conductivity type;

a first inner isolation pattern provided between the first and second photoelectric conversion regions and spaced apart from the first pixel isolation pattern;

a connection region, which is provided between the first pixel isolation pattern and the first inner isolation pattern to connect the first and second photoelectric conversion regions to each other, the connection region comprising impurities of the second conductivity type; and a second inner isolation pattern disposed in the first pixel region and extending from the second surface toward the connection region and vertically spaced apart from the first surface.

14. The image sensor of claim 13, wherein the impurities of the second conductivity type in the connection region and the impurities of the second conductivity type in the second photoelectric conversion region have the same concentration at the same vertical level.

15. The image sensor of claim 13, wherein a top surface of the second inner isolation pattern is closer to the first surface than to the second surface.

16. The image sensor of claim 13, further comprising:

a gate electrode provided adjacent to the first surface, wherein the connection region is closer to the first surface than to the second surface.

17. An image sensor, comprising:

a semiconductor substrate of a first conductivity type, the semiconductor substrate comprising a pixel region and having a first surface and a second surface opposite each other in a first, vertical, direction with respect to the first surface;

a plurality of photoelectric conversion regions, which are provided in the pixel region and comprise impurities of a second conductivity type different from the first conductivity type;

a gate electrode provided on the photoelectric conversion regions and adjacent to the first surface;

a first isolation structure, which is extended from the first surface toward the second surface, the first isolation structure comprising a first pixel isolation pattern, which encloses the pixel region, and a first inner isolation pattern, which is spaced apart from the first pixel isolation pattern and is positioned between two adjacent photelectric conversion regions of the plurality of photoelectric conversion regions;
a second isolation structure, which is extended from the second surface toward the first surface, the second isolation structure comprising a second pixel isolation pattern, which encloses the pixel region, and a second inner isolation pattern, which is connected to the second pixel isolation pattern and is positioned in the pixel region;
a barrier region, which is provided in the semiconductor substrate to cover side surfaces of the first isolation structure and comprises impurities of the first conductivity type; and
a connection region comprising impurities of the second conductivity type, the connection region being provided between the first pixel isolation pattern and the first inner isolation pattern to connect two adjacent photoconversion regions of the plurality of photoelectric conversion regions.

18. The image sensor of claim 17,
wherein a length, in a vertical direction, of the second inner isolation pattern is different from that, in the vertical direction, of the second pixel isolation pattern.

19. The image sensor of claim 17,
wherein the first pixel isolation pattern and the second isolation structure are vertically spaced apart from each other.

20. The image sensor of claim 17,
wherein a length, in a vertical direction, of the first pixel isolation pattern is greater than that, in the vertical direction, of the second pixel isolation pattern.

* * * * *